United States Patent
Honda et al.

(10) Patent No.: US 10,290,744 B2
(45) Date of Patent: *May 14, 2019

(54) SEMICONDUCTOR DEVICE

(71) Applicant: Semiconductor Energy Laboratory Co., Ltd., Atsugi-shi, Kanagawa-ken (JP)

(72) Inventors: Tatsuya Honda, Isehara (JP); Masashi Tsubuku, Atsugi (JP); Yusuke Nonaka, Atsugi (JP); Takashi Shimazu, Nagoya (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/422,945

(22) Filed: Feb. 2, 2017

(65) Prior Publication Data
US 2017/0148925 A1    May 25, 2017

Related U.S. Application Data

(63) Continuation of application No. 14/682,356, filed on Apr. 9, 2015, now Pat. No. 9,741,860, which is a
(Continued)

(30) Foreign Application Priority Data

Sep. 29, 2011  (JP) ................. 2011-215682

(51) Int. Cl.
*H01L 29/786* (2006.01)
*H01L 29/04* (2006.01)
(Continued)

(52) U.S. Cl.
CPC ........ *H01L 29/7869* (2013.01); *G02F 1/1337* (2013.01); *G02F 1/13394* (2013.01);
(Continued)

(58) Field of Classification Search
CPC .................................................. H01L 29/7869
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| CN | 001622340 A | 6/2005 |
| CN | 101339954 A | 1/2009 |

(Continued)

OTHER PUBLICATIONS

Kamiya.T et al., "Carrier transport properties and electronic structures of amorphous oxide semiconductors: the present status", Solid State Physics, Sep. 1, 2009, vol. 44, No. 9, pp. 621-633, Ange Gijutsu Center.

(Continued)

*Primary Examiner* — Peniel M Gumedzoe
*Assistant Examiner* — Christopher A Johnson
(74) *Attorney, Agent, or Firm* — Robinson Intellectual Property Law Office; Eric J. Robinson

(57) ABSTRACT

A semiconductor device includes a gate electrode, a gate insulating film which includes oxidized material containing silicon and covers the gate electrode, an oxide semiconductor film provided to be in contact with the gate insulating film and overlap with at least the gate electrode, and a source electrode and a drain electrode electrically connected to the oxide semiconductor film. In the oxide semiconductor film, a first region which is provided to be in contact with the gate insulating film and have a thickness less than or equal to 5 nm has a silicon concentration lower than or equal to 1.0 at. %, and a region in the oxide semiconductor film other than
(Continued)

US 10,290,744 B2

Page 2 the first region has lower silicon concentration than the first region. At least the first region includes a crystal portion.

12 Claims, 25 Drawing Sheets

Related U.S. Application Data continuation of application No. 13/626,261, filed on Sep. 25, 2012, now Pat. No. 9,029,852.

(51) Int. Cl.
*H01L 29/24* (2006.01)
*H01L 29/51* (2006.01)
*G02F 1/1333* (2006.01)
*G02F 1/1337* (2006.01)
*G02F 1/1339* (2006.01)
*G02F 1/1343* (2006.01)
*H01L 27/12* (2006.01)
*H01L 29/66* (2006.01)
*H01L 21/02* (2006.01)
*H01L 27/32* (2006.01)

(52) U.S. Cl.
CPC .. *G02F 1/133345* (2013.01); *G02F 1/134309* (2013.01); *H01L 27/1225* (2013.01); *H01L 29/045* (2013.01); *H01L 29/24* (2013.01); *H01L 29/51* (2013.01); *H01L 29/66969* (2013.01); *H01L 29/78696* (2013.01); *G02F 2202/10* (2013.01); *H01L 21/02565* (2013.01); *H01L 27/3262* (2013.01)

(56) References Cited

U.S. PATENT DOCUMENTS

| | | |
|---|---|---|
| 5,973,369 A | 10/1999 | Hayashi |
| 6,077,574 A | 6/2000 | Usami |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,105,889 B2 | 9/2006 | Bojarczuk, Jr. et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,452,767 B2 | 11/2008 | Bojarczuk, Jr. et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,479,683 B2 | 1/2009 | Bojarczuk, Jr. et al. |
| 7,488,655 B2 | 2/2009 | Hayashi et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,278 B2 | 6/2010 | Bojarczuk, Jr. et al. |
| 7,745,798 B2 | 6/2010 | Takahashi |
| 7,791,072 B2 | 9/2010 | Kumomi et al. |
| 7,825,476 B2 | 11/2010 | Yang et al. |
| 7,851,792 B2 | 12/2010 | Aiba et al. |
| 7,872,261 B2 | 1/2011 | Ikeda |
| 7,923,722 B2 | 4/2011 | Ryu et al. |
| 7,923,723 B2 | 4/2011 | Hayashi et al. |
| 7,928,514 B2 | 4/2011 | Bojarczuk, Jr. et al. |
| 7,932,521 B2 | 4/2011 | Akimoto et al. |
| 7,935,964 B2 | 5/2011 | Kim et al. |
| 7,994,500 B2 | 8/2011 | Kim et al. |
| 7,998,372 B2 | 8/2011 | Yano et al. |
| 8,058,645 B2 | 11/2011 | Jeong et al. |
| 8,148,779 B2 | 4/2012 | Jeong et al. |
| 8,158,974 B2 | 4/2012 | Yano et al. |
| 8,158,976 B2 | 4/2012 | Son et al. |
| 8,168,544 B2 | 5/2012 | Chang |
| 8,188,471 B2 | 5/2012 | Iwasaki et al. |
| 8,188,480 B2 | 5/2012 | Itai |
| 8,193,045 B2 | 6/2012 | Omura et al. |
| 8,193,051 B2 | 6/2012 | Bojarczuk, Jr. et al. |
| 8,202,365 B2 | 6/2012 | Umeda et al. |
| 8,203,143 B2 | 6/2012 | Imai |
| 8,207,756 B2 | 6/2012 | Shionoiri et al. |
| 8,236,635 B2 | 8/2012 | Suzawa et al. |
| 8,237,166 B2 | 8/2012 | Kumomi et al. |
| 8,242,494 B2 | 8/2012 | Suzawa et al. |
| 8,258,023 B2 | 9/2012 | Lee |
| 8,274,078 B2 | 9/2012 | Itagaki et al. |
| 8,293,661 B2 | 10/2012 | Yamazaki |
| 8,304,765 B2 | 11/2012 | Yamazaki et al. |
| 8,309,961 B2 | 11/2012 | Yamazaki et al. |
| 8,314,032 B2 | 11/2012 | Kawamura et al. |
| 8,319,215 B2 | 11/2012 | Yamazaki et al. |
| 8,343,799 B2 | 1/2013 | Ito et al. |
| 8,344,387 B2 | 1/2013 | Akimoto et al. |
| 8,362,478 B2 | 1/2013 | Yamazaki et al. |
| 8,377,744 B2 | 2/2013 | Yamazaki et al. |
| 8,384,076 B2 | 2/2013 | Park et al. |
| 8,384,077 B2 | 2/2013 | Yano et al. |
| 8,395,931 B2 | 3/2013 | Yamazaki et al. |
| 8,399,882 B2 | 3/2013 | Jeon et al. |
| 8,427,595 B2 | 4/2013 | Yamazaki et al. |
| 8,445,902 B2 | 5/2013 | Sato et al. |
| 8,445,903 B2 | 5/2013 | Inoue et al. |
| 8,481,377 B2 | 7/2013 | Akimoto et al. |
| 8,492,862 B2 | 7/2013 | Yamazaki et al. |
| 8,513,661 B2 | 8/2013 | Takahashi et al. |
| 8,518,740 B2 | 8/2013 | Yamazaki et al. |
| 8,530,273 B2 | 9/2013 | Den Boer |
| 8,546,182 B2 | 10/2013 | Akimoto et al. |
| 8,552,434 B2 | 10/2013 | Akimoto et al. |
| 8,558,233 B2 | 10/2013 | Yamazaki |
| 8,610,187 B2 | 12/2013 | Yamazaki et al. |
| 8,618,537 B2 | 12/2013 | Kaneko et al. |
| 8,624,240 B2 | 1/2014 | Sato et al. |
| 8,629,432 B2 | 1/2014 | Sakata et al. |
| 8,633,480 B2 | 1/2014 | Yamazaki et al. |
| 8,643,018 B2 | 2/2014 | Yamazaki et al. |
| 8,664,036 B2 | 3/2014 | Yamazaki et al. |
| 8,692,252 B2 | 4/2014 | Takata et al. |
| 8,698,214 B2 | 4/2014 | Honda et al. |
| 8,729,613 B2 | 5/2014 | Honda et al. |
| 8,779,419 B2 | 7/2014 | Yano et al. |
| 8,786,793 B2 | 7/2014 | Yamazaki |
| 8,841,163 B2 | 9/2014 | Yamazaki et al. |
| 8,872,171 B2 | 10/2014 | Yamazaki et al. |
| 8,884,287 B2 | 11/2014 | Sakata et al. |
| 8,937,020 B2 | 1/2015 | Yamazaki et al. |
| 8,952,380 B2 | 2/2015 | Honda et al. |
| 8,957,414 B2 | 2/2015 | Yamazaki et al. |
| 8,981,369 B2 | 3/2015 | Yano et al. |
| 9,029,852 B2 | 5/2015 | Honda et al. |
| 9,040,989 B2 | 5/2015 | Yamazaki |
| 9,087,908 B2 | 7/2015 | Honda et al. |
| 9,093,328 B2 | 7/2015 | Yamazaki et al. |
| 9,093,544 B2 | 7/2015 | Yamazaki et al. |
| 9,105,734 B2 | 8/2015 | Honda et al. |
| 9,123,574 B2 | 9/2015 | Yamazaki et al. |
| 9,130,045 B2 | 9/2015 | Lee |
| 9,171,938 B2 | 10/2015 | Yamazaki et al. |
| 9,184,298 B2 | 11/2015 | Morita et al. |
| 9,214,563 B2 | 12/2015 | Yamazaki et al. |
| 9,219,160 B2 | 12/2015 | Honda et al. |
| 9,240,467 B2 | 1/2016 | Yamazaki et al. |

(56) References Cited

U.S. PATENT DOCUMENTS

| | | |
|---|---|---|
| 9,391,095 B2 | 7/2016 | Yamazaki et al. |
| 9,530,872 B2 | 12/2016 | Yamazaki et al. |
| 9,721,811 B2 | 8/2017 | Yamazaki et al. |
| 9,741,860 B2 | 8/2017 | Honda et al. |
| 9,853,066 B2 | 12/2017 | Yamazaki et al. |
| 9,978,757 B2 | 5/2018 | Yamazaki et al. |
| 10,079,251 B2 | 9/2018 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051109 A1 | 3/2004 | Ishizaki et al. |
| 2004/0127038 A1 | 7/2004 | Carcia et al. |
| 2005/0017302 A1 | 1/2005 | Hoffman |
| 2005/0029591 A1 | 2/2005 | Yudasaka et al. |
| 2005/0084610 A1 | 4/2005 | Selitser |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108585 A1 | 5/2006 | Gan et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2009/0002590 A1 | 1/2009 | Kimura |
| 2009/0008638 A1 | 1/2009 | Kang et al. |
| 2009/0066472 A1 | 3/2009 | Kondo |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0111244 A1 | 4/2009 | Yamazaki et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0072469 A1 | 3/2010 | Yamazaki et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0117999 A1 | 5/2010 | Matsunaga et al. |
| 2010/0123130 A1 | 5/2010 | Akimoto et al. |
| 2010/0123136 A1 | 5/2010 | Lee et al. |
| 2010/0140609 A1 | 6/2010 | Yano et al. |
| 2010/0148170 A1 | 6/2010 | Ueda et al. |
| 2010/0155717 A1 | 6/2010 | Yano et al. |
| 2010/0163885 A1 | 7/2010 | Park et al. |
| 2010/0181565 A1* | 7/2010 | Sakata ............... C23C 14/086 257/43 |
| 2010/0187523 A1 | 7/2010 | Sakata et al. |
| 2010/0193782 A1 | 8/2010 | Sakata |
| 2010/0193784 A1 | 8/2010 | Morosawa et al. |
| 2010/0219410 A1 | 9/2010 | Godo et al. |
| 2010/0258794 A1 | 10/2010 | Iwasaki et al. |
| 2010/0289020 A1 | 11/2010 | Yano et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0003428 A1 | 1/2011 | Sasaki et al. |
| 2011/0017990 A1 | 1/2011 | Son et al. |
| 2011/0031497 A1 | 2/2011 | Yamazaki et al. |
| 2011/0032444 A1 | 2/2011 | Yamazaki et al. |
| 2011/0050733 A1 | 3/2011 | Yano et al. |
| 2011/0057188 A1 | 3/2011 | Yamazaki et al. |
| 2011/0062433 A1 | 3/2011 | Yamazaki |
| 2011/0062436 A1 | 3/2011 | Yamazaki et al. |
| 2011/0068335 A1* | 3/2011 | Yamazaki ........... H01L 27/1225 257/43 |
| 2011/0084264 A1 | 4/2011 | Yamazaki et al. |
| 2011/0084266 A1 | 4/2011 | Yamazaki et al. |
| 2011/0084271 A1 | 4/2011 | Yamazaki et al. |
| 2011/0117698 A1 | 5/2011 | Suzawa et al. |
| 2011/0133191 A1 | 6/2011 | Yamazaki |
| 2011/0134683 A1* | 6/2011 | Yamazaki ............. G11C 11/405 365/149 |
| 2011/0140098 A1 | 6/2011 | Akimoto et al. |
| 2011/0147738 A1 | 6/2011 | Yamazaki et al. |
| 2011/0151618 A1 | 6/2011 | Yamazaki et al. |
| 2011/0182110 A1 | 7/2011 | Yamazaki et al. |
| 2011/0193079 A1 | 8/2011 | Endo et al. |
| 2011/0193081 A1 | 8/2011 | Godo et al. |
| 2011/0193083 A1 | 8/2011 | Kim et al. |
| 2011/0198586 A1 | 8/2011 | Inoue et al. |
| 2011/0204355 A1 | 8/2011 | Suzuki et al. |
| 2011/0204362 A1 | 8/2011 | Akimoto et al. |
| 2011/0215328 A1 | 9/2011 | Morosawa et al. |
| 2011/0215331 A1 | 9/2011 | Yamazaki et al. |
| 2011/0233763 A1 | 9/2011 | Pendse et al. |
| 2012/0001167 A1 | 1/2012 | Morosawa |

(56) References Cited

U.S. PATENT DOCUMENTS

| | | |
|---|---|---|
| 2012/0104381 A1 | 5/2012 | Shieh et al. |
| 2012/0119205 A1 | 5/2012 | Taniguchi et al. |
| 2012/0138922 A1 | 6/2012 | Yamazaki et al. |
| 2012/0242627 A1 | 9/2012 | Kim et al. |
| 2012/0256179 A1 | 10/2012 | Yamazaki et al. |
| 2012/0268682 A1 | 10/2012 | Yamazaki |
| 2013/0009111 A1 | 1/2013 | Morita et al. |
| 2013/0037793 A1 | 2/2013 | Pan et al. |
| 2013/0069053 A1 | 3/2013 | Yamazaki et al. |
| 2013/0082262 A1 | 4/2013 | Honda et al. |
| 2013/0082263 A1 | 4/2013 | Honda et al. |
| 2013/0092944 A1 | 4/2013 | Honda et al. |
| 2013/0092945 A1 | 4/2013 | Honda et al. |
| 2013/0099230 A1 | 4/2013 | Yamazaki et al. |
| 2013/0105791 A1 | 5/2013 | Honda et al. |
| 2013/0105865 A1 | 5/2013 | Honda et al. |
| 2013/0126863 A1 | 5/2013 | Yamazaki et al. |
| 2013/0127694 A1 | 5/2013 | Kim et al. |
| 2013/0187154 A1 | 7/2013 | Uchiyama et al. |
| 2013/0214273 A1 | 8/2013 | Yamazaki et al. |
| 2013/0234134 A1 | 9/2013 | Inoue et al. |
| 2013/0309808 A1 | 11/2013 | Zhangs et al. |
| 2013/0328044 A1 | 12/2013 | Yamazaki et al. |
| 2014/0030846 A1 | 1/2014 | Akimoto et al. |
| 2014/0042433 A1 | 2/2014 | Yamazaki |
| 2014/0042434 A1 | 2/2014 | Yamazaki |
| 2014/0042435 A1 | 2/2014 | Yamazaki |
| 2014/0042436 A1 | 2/2014 | Yamazaki |
| 2014/0042437 A1 | 2/2014 | Yamazaki |
| 2014/0042438 A1 | 2/2014 | Yamazaki |
| 2014/0091301 A1 | 4/2014 | Yamazaki |
| 2014/0169100 A1 | 6/2014 | Yamazaki et al. |
| 2014/0191230 A1 | 7/2014 | Honda et al. |
| 2015/0048363 A1 | 2/2015 | Yamazaki et al. |
| 2015/0136594 A1 | 5/2015 | Yamazaki et al. |
| 2015/0243792 A1 | 8/2015 | Honda et al. |
| 2015/0311348 A1 | 10/2015 | Honda et al. |
| 2015/0333089 A1 | 11/2015 | Yamazaki et al. |
| 2016/0056299 A1 | 2/2016 | Honda et al. |
| 2017/0352551 A1 | 12/2017 | Yamazaki et al. |
| 2019/0035818 A1 | 1/2019 | Yamazaki et al. |

FOREIGN PATENT DOCUMENTS

| | | |
|---|---|---|
| CN | 101794820 A | 8/2010 |
| CN | 101796644 A | 8/2010 |
| CN | 102160105 A | 8/2011 |
| EP | 1737044 A | 12/2006 |
| EP | 2037267 A | 3/2009 |
| EP | 2226847 A | 9/2010 |
| EP | 2256814 A | 12/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-008340 A | 1/1997 |
| JP | 09-178686 A | 7/1997 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2001-077443 A | 3/2001 |
| JP | 2002-076356 A | 3/2002 |
| JP | 2002-289859 A | 10/2002 |
| JP | 2003-029293 A | 1/2003 |
| JP | 2003-041362 A | 2/2003 |
| JP | 2003-086000 A | 3/2003 |
| JP | 2003-086808 A | 3/2003 |
| JP | 2004-103957 A | 4/2004 |
| JP | 2004-266263 A | 9/2004 |
| JP | 2004-273614 A | 9/2004 |
| JP | 2004-273732 A | 9/2004 |
| JP | 2006-165528 A | 6/2006 |
| JP | 2007-096055 A | 4/2007 |
| JP | 2007-115735 A | 5/2007 |
| JP | 2007-121788 A | 5/2007 |
| JP | 2007-158147 A | 6/2007 |
| JP | 2007-220820 A | 8/2007 |
| JP | 2008-277665 A | 11/2008 |
| JP | 2008-311342 A | 12/2008 |
| JP | 2009-081413 A | 4/2009 |
| JP | 2009-085944 A | 4/2009 |
| JP | 2009-099847 A | 5/2009 |
| JP | 2009-231613 A | 10/2009 |
| JP | 2009-265271 A | 11/2009 |
| JP | 2010-016347 A | 1/2010 |
| JP | 4415062 | 2/2010 |
| JP | 2010-067954 A | 3/2010 |
| JP | 2010-097212 A | 4/2010 |
| JP | 2010-177431 A | 8/2010 |
| JP | 2010-177450 A | 8/2010 |
| JP | 2010-186994 A | 8/2010 |
| JP | 2010-192881 A | 9/2010 |
| JP | 4571221 | 10/2010 |
| JP | 2011-009719 A | 1/2011 |
| JP | 2011-091381 A | 5/2011 |
| JP | 2011-096884 A | 5/2011 |
| JP | 2011-119714 A | 6/2011 |
| JP | 2011-119718 A | 6/2011 |
| JP | 2011-122238 A | 6/2011 |
| JP | 2011-139050 A | 7/2011 |
| JP | 2011-142310 A | 7/2011 |
| JP | 2011-142315 A | 7/2011 |
| JP | 2011-146697 A | 7/2011 |
| JP | 2011-151377 A | 8/2011 |
| JP | 2011-169757 A | 9/2011 |
| JP | 2011-205017 A | 10/2011 |
| JP | 2012-124446 A | 6/2012 |
| JP | 2012-160679 A | 8/2012 |
| JP | 5430785 | 3/2014 |
| JP | 2017-143286 A | 8/2017 |
| KR | 2010-0061511 A | 6/2010 |
| KR | 2010-0084466 A | 7/2010 |
| KR | 2010-0094509 A | 8/2010 |
| KR | 2011-0076916 A | 7/2011 |
| TW | 201023315 | 6/2010 |
| TW | 201114040 | 4/2011 |
| WO | WO-2004/114391 | 12/2004 |
| WO | WO-2008/117739 | 10/2008 |
| WO | WO-2008/133345 | 11/2008 |
| WO | WO-2009/031634 | 3/2009 |
| WO | WO-2009/034953 | 3/2009 |
| WO | WO-2009/075281 | 6/2009 |
| WO | WO-2010/032639 | 3/2010 |
| WO | WO-2010/047077 | 4/2010 |
| WO | WO-2011/037010 | 3/2011 |
| WO | WO-2011/055620 | 5/2011 |
| WO | WO-2011/055631 | 5/2011 |
| WO | WO-2011/058882 | 5/2011 |
| WO | WO-2011/068033 | 6/2011 |
| WO | WO-2011/070887 | 6/2011 |
| WO | WO-2011/070900 | 6/2011 |
| WO | WO-2011/074392 | 6/2011 |
| WO | WO-2011/074409 | 6/2011 |
| WO | WO-2013/047629 | 4/2013 |

OTHER PUBLICATIONS

International Search Report (Application No. PCT/JP2012/074814) dated Nov. 6, 2012.

Written Opinion (Application No. PCT/JP2012/074814) dated Nov. 6, 2012.

Nakayama et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

(56) References Cited

OTHER PUBLICATIONS

Fortunato.E et al., "Wide-Bandgap High-Mobility ZnO Thin-Film Transistors Produced at Room Temperature", APPL. PHYS. LETT. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", APPL. PHYS. LETT. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", APPL. PHYS. LETT. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. APPL. PHYS. (Journal of Applied Physics) , Feb. 1, 2003, vol. 93, No. 3, pp. 1624-1630.

Asakuma.N. et al., "Crystallization and Reduction of SOL-GEL-Derived Zinc Oxide Films by Irradiation With Ultraviolet Lamp", Journal of SOL-GEL Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline InGaO3(ZnO)5 films", APPL. PHYS. LETT. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son,K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", ADV. MATER. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", PHYS. REV. LETT. (Physical Review Letters), Jul. 31, 2000, vol. 85, No. 5, pp, 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al,, "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65,2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. SOC. INF. DISPLAY (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT",

(56) References Cited

OTHER PUBLICATIONS

SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the $In_2O_3$ and $SC_2O_3$—$A_2O_3$—BO Systems [A; Fe, Ga, or Al; N: Mg, Mn, Fe, Ni, Cu, or Zn] at Temperatures Over 1000° C.", Journal of Solid State Chemistry, 1985, Vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", PHYS. REV. A (Physical Review. A), May 1, 1984, vol. 29, No. 5, pp. 2957-2959.

Meiboom.S et al., "Theory of the Blue Phase of Cholesteric Liquid Crystals", PHYS. REV. LETT. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", PHYS. REV. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", JPN. J. APPL. PHYS. (Japanese Journal of Applied Physics) , 2006, vol. 45, No. 5B, pp. 4303-4308.

Janotti.A et al., "Native Point Defects in ZnO", PHYS. REV. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor upon exposure to Water", APPL. PHYS. LETT. ( Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et at., "Oxygen Vacancies In ZnO", APPL. PHYS. LETT. (Applied Physics Letters) , 2005, vol. 87, pp. 122102-1-122102-3.

Oba.F et al., "Defect energetics in ZnO: A hybrid Hartree-Fock density functional study", PHYS. REV. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001 vol. 81, No. 5, pp. 501-515.

Hosono.H et al., "Working hypothesis to explore novel wide band gap electrically conducting amorphous oxides and examples", J. NON-CRYST. SOLIDS (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopabiilty, Intrinsic Conductivity, and Nonstoichiometry of Transparent Conducting Oxides", PHYS. REV. LETT. (Physical Review Letters), Jan. 26, 2007, vol. 98, pp. 045501-1-045501-4.

Park.J et al., "Dry etching of ZnO films and plasma-induced damage to optical properties", J. VAC. SCI. TECHNOL. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. ELECTROCHEM. SOC. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", APPL. PHYS. LETT. (Applied Physics Letters) , Sep. 1, 2003, vol. 83, No. 9, pp. 1755-1757.

Chinese Office Action (Application No. 201280047612.5) dated Apr. 13, 2016.

"Chapter 2 Basic concept necessary for crystal growth", Handbook of Crystal Growth, Sep. 1, 1995, p. 22, KYORITSU SHUPPAN.

Indian Office Action (Application No. 11072/DELNP/2013) dated Jan. 2, 2019.

\* cited by examiner

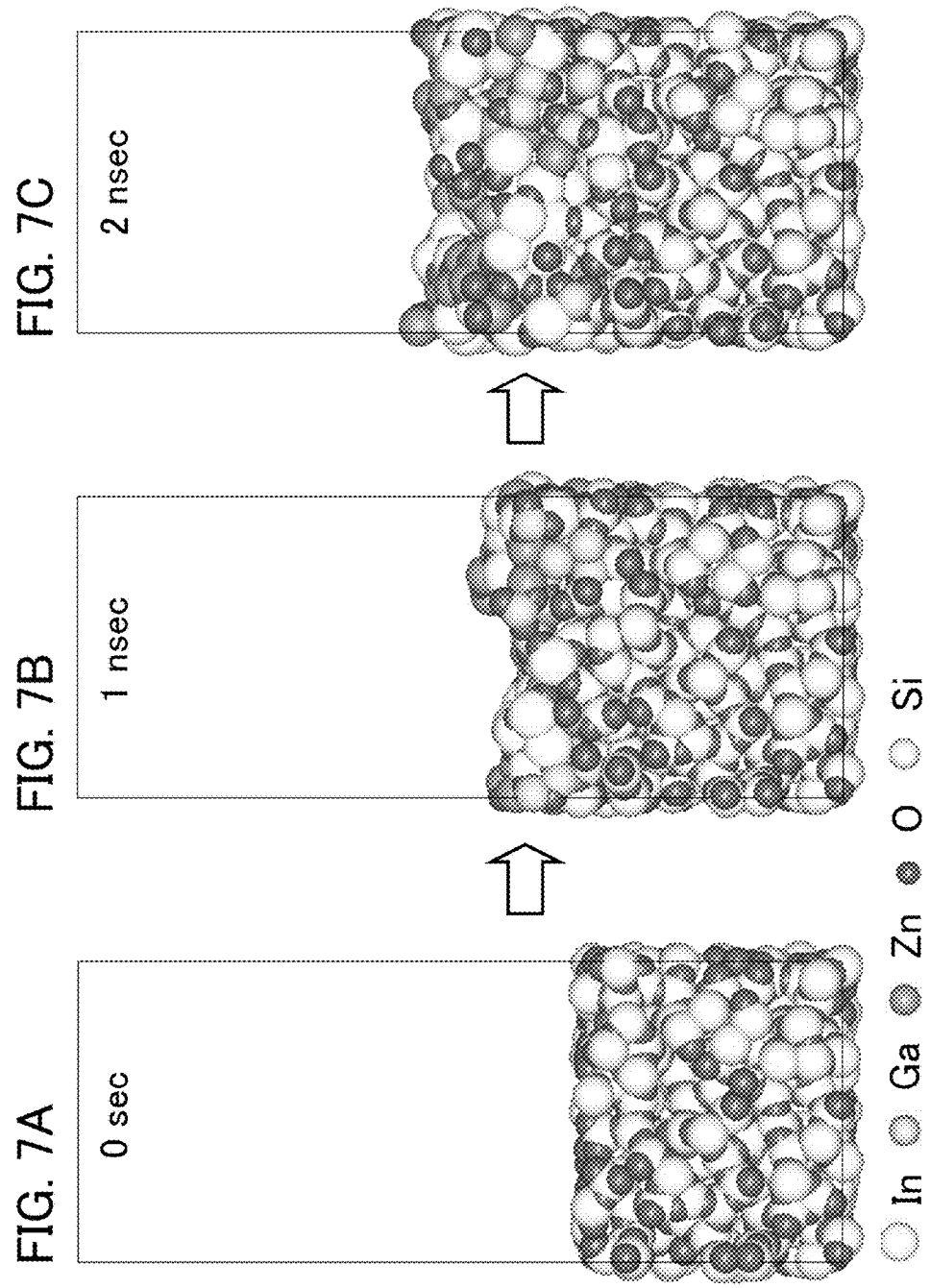

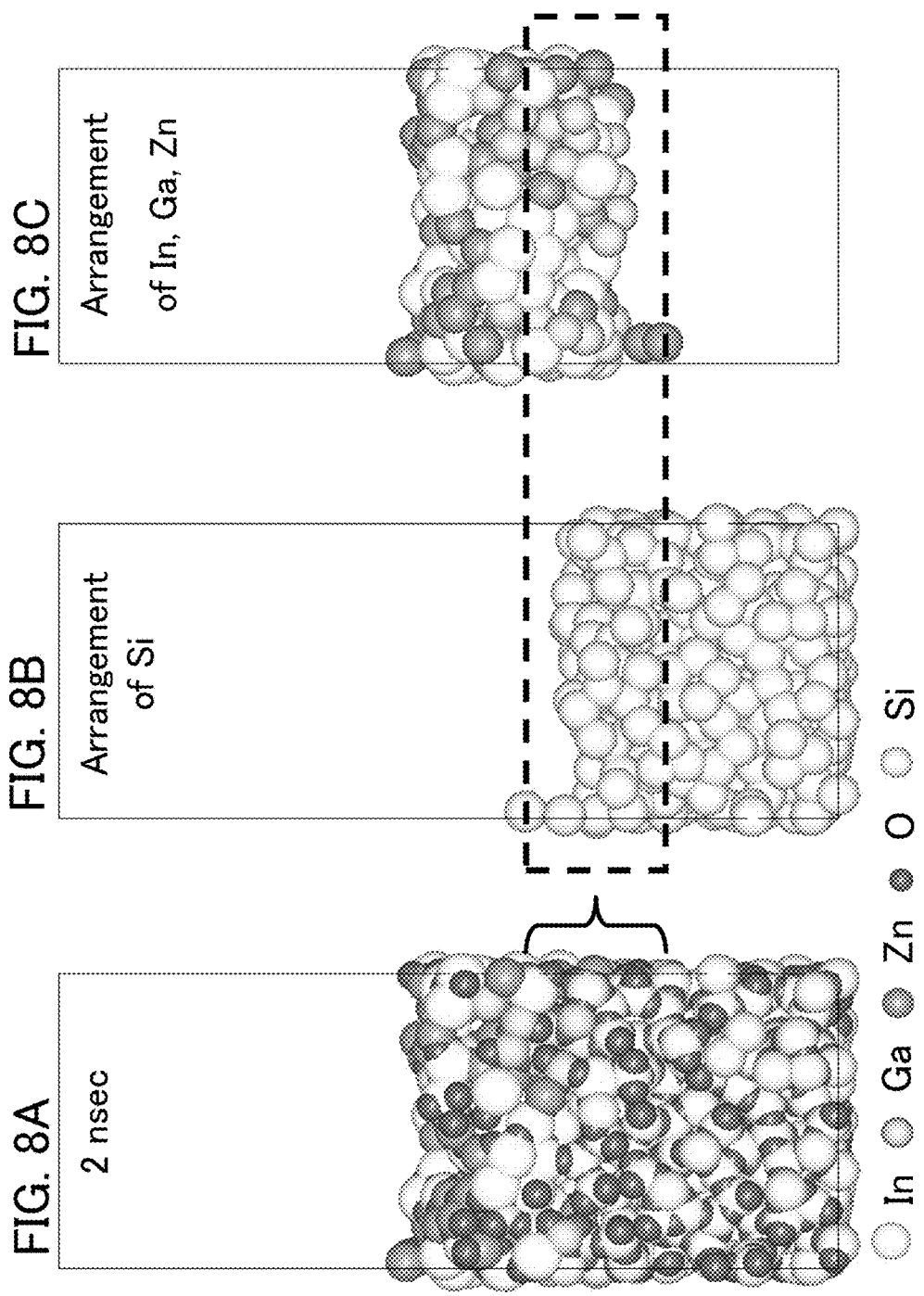

SEMICONDUCTOR DEVICE

TECHNICAL FIELD

The present invention relates to a semiconductor device and a method for manufacturing the semiconductor device.

In this specification, a semiconductor device generally means a device which can function by utilizing semiconductor characteristics, and an electrooptic device, a semiconductor circuit, and electronic equipment are all semiconductor devices.

BACKGROUND ART

A technique by which a transistor is formed using a semiconductor thin film formed over a substrate having an insulating surface has attracted attention. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide including indium (In), gallium (Ga), and zinc (Zn) is disclosed (see Patent Document 1).

Transistors including oxide semiconductors have on-state characteristics (e.g., on-state current) superior to those of transistors including amorphous silicon. In order to apply the transistors including oxide semiconductors to high-performance devices, such transistors are required to have further improved characteristics, and thus techniques of crystallization of oxide semiconductors have been developed (Patent Document 2). In Patent Document 2, a technique in which an oxide semiconductor is crystallized by heat treatment is disclosed.

REFERENCE

Patent Document

[Patent Document 1] Japanese Published Patent Application No. 2006-165528
[Patent Document 2] Japanese Published Patent Application No. 2008-311342

DISCLOSURE OF INVENTION

An oxide semiconductor film used in a transistor is formed by a sputtering method in many cases. However, when the oxide semiconductor film is formed by sputtering, in some cases, an ionized rare gas element or a particle ejected from a surface of a target flicks off a particle of a film, such as a gate insulating film, on which the oxide semiconductor film is to be formed (the film is also referred to as "formed film"). Particles flicked off from the formed film enter the oxide semiconductor film and functions as an impurity element therein. In particular, the oxide semiconductor film in the vicinity of a surface of the formed film (the surface is also referred to as "formed film surface") may have high concentration of the impurity element. Further, when the impurity element is left in the oxide semiconductor film in the vicinity of the formed film surface, the impurity element causes adversely effect on characteristics of the transistor.

Furthermore, the impurity element included in the oxide semiconductor film in the vicinity of the formed film surface inhibits crystallization of the oxide semiconductor film. As a result, an amorphous region is left in the oxide semiconductor film in the vicinity of the formed film surface.

Thus, the following countermeasure can be considered: the oxide semiconductor film is made thick, and a crystal region formed in a surface layer is used. However, in order to reduce parasitic capacitance and to operate the transistor with lower power, the oxide semiconductor film is desirably formed thin. In that case, a channel formation region is formed in the oxide semiconductor film in the vicinity of the formed film surface, and crystallization of the oxide semiconductor film is desirably progressed in the vicinity of the formed film surface accordingly.

In view of the above problem, an object is to reduce the concentration of impurities included in an oxide semiconductor film in the vicinity of the formed film surface. Further, an object is to improve crystallinity of the oxide semiconductor film. Further, an object is to provide a semiconductor device having stable electric characteristics with use of the oxide semiconductor film.

One embodiment of the disclosed invention is a semiconductor device including an insulating film which includes oxidized material containing silicon, an oxide semiconductor film provided to be in contact with the insulating film, a source electrode and a drain electrode electrically connected to the oxide semiconductor film, and a gate electrode adjacent to the oxide semicondur film. The oxide semiconductor film includes a first region in which a concentration of silicon distributed from an interface with the gate insulating film toward an inside of the oxide semiconductor film is lower than or equal to 1.0 at. %, and at least the first region includes a crystal portion. The gate electrode may be located below the oxide semiconductor film with the insulating film interposed therebetween.

One embodiment of the disclosed invention is a semiconductor device including a gate electrode, a gate insulating film which includes oxidized material containing silicon and covers the gate electrode, an oxide semiconductor film provided to be in contact with the gate insulating film and overlap with at least the gate electrode, a channel protective film provided to be in contact with the oxide semiconductor film, and a source electrode and a drain electrode which are provided over the channel protective film and electrically connected to the oxide semiconductor film. The oxide semiconductor film includes a first region in which a concentration of silicon distributed from an interface with the gate insulating film toward an inside of the oxide semiconductor film is lower than or equal to 1.0 at. %, and at least the first region includes a crystal portion.

In each of the above structures, the first region is preferably provided to be in contact with the gate insulating film or the insulating film and have a thickness less than or equal to 5 nm, and the concentration of silicon included in a region other than the first region is preferably lower than the concentration of silicon included in the first region.

In each of the above structures, the region in the oxide semiconductor film other than the first region preferably includes a crystal portion.

Further, one embodiment of the disclosed invention is a semiconductor device including a gate electrode, a gate insulating film which includes oxidized material containing silicon and covers the gate electrode, an oxide semiconductor film provided to be in contact with the gate insulating film and overlap with at least the gate electrode, a source electrode and a drain electrode electrically connected to the oxide semiconductor film, and a protective insulating film which includes oxidized material containing silicon and covers the oxide semiconductor film and the source electrode and the drain electrode. The oxide semiconductor film includes a first region in which a concentration of silicon distributed from an interface with the gate insulating film toward an inside of the oxide semiconductor film is lower than or equal to 1.0 at. %. The oxide semiconductor film includes a second region in which a concentration of silicon distributed from an interface with the protective insulating film toward the inside of the oxide semiconductor film is lower than or equal to 1.0 at. %. At least the first region and the second region include a crystal portion.

In each of the above structures, the first region is preferably provided to be in contact with the gate insulating film and have a thickness less than or equal to 5 nm, the second region is preferably provided to be in contact with the protective insulating film and have a thickness less than or equal to 5 nm, and the concentration of silicon included in a region other than the first region and the second region is preferably lower than the concentrations of silicon included in the first region and the second region.

Further, in each of the above structures, a crystal portion is preferably included in the region in the oxide semiconductor film other than the first region and the second region.

Further, in each of the above structures, a c-axis of the crystal portion is preferably aligned in a direction perpendicular to the interface between the oxide semiconductor film and the gate insulating film or the insulating film.

Further, in each of the above structures, the concentration of silicon included in the first region is preferably lower than or equal to 0.1 at. %.

Further, in each of the above structures, the gate insulating film or the insulating film includes carbon, and the concentration of carbon in the first region is preferably lower than or equal to $1.0 \times 10^{20}$ atoms/cm$^3$.

According to one embodiment of the disclosed invention, the concentration of impurities included in the oxide semiconductor film in the vicinity of the formed film surface can be reduced. In addition, crystallinity of the oxide semiconductor film can be improved. Thus, with use of such an oxide semiconductor film, a semiconductor device having stable electric characteristics can be provided.

BRIEF DESCRIPTION OF DRAWINGS

FIGS. 7A to 7C show calculation results.

FIGS. 8A to 8C show calculation results.

BEST MODE FOR CARRYING OUT THE INVENTION

Figure 1A:
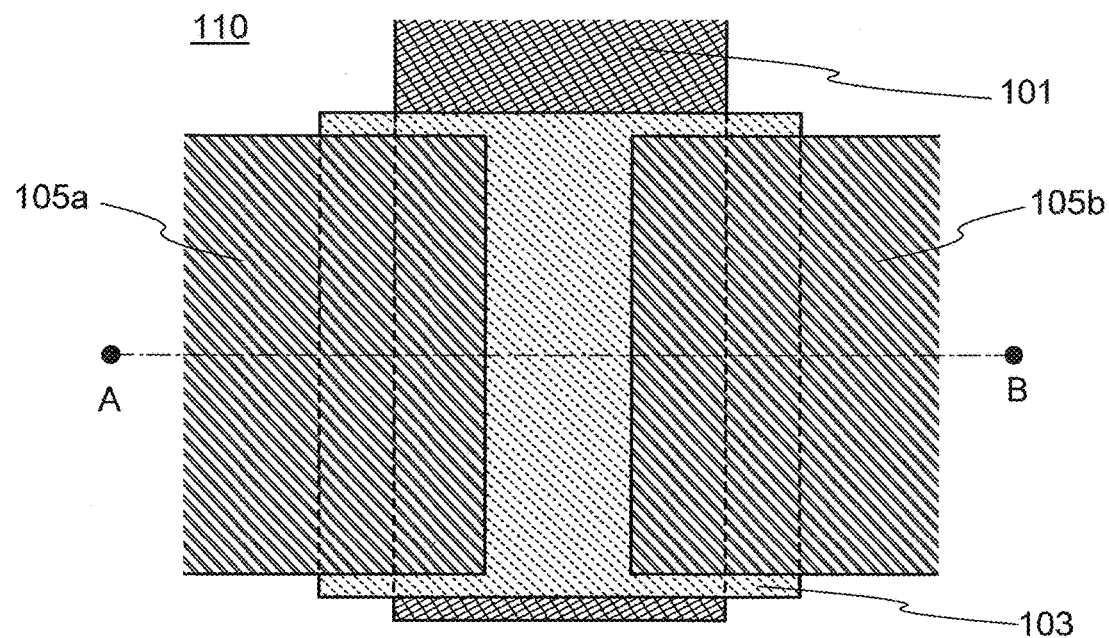
FIGS. 1A and 1B are a plan view and a cross-sectional view illustrating one embodiment of a semiconductor device.

Hereinafter, embodiments of the invention disclosed in this specification will be described in detail with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in the drawings and the like are not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Embodiment 1

In this embodiment, one embodiment of a semiconductor device and a manufacturing method thereof will be described with reference to FIGS. 1A and 1B, FIGS. 2A and 2B, FIGS. 3A and 3B, FIGS. 4A to 4E, and FIGS. 5A to 5E.
<Example of Structure of Semiconductor Device>

Figure 1B:
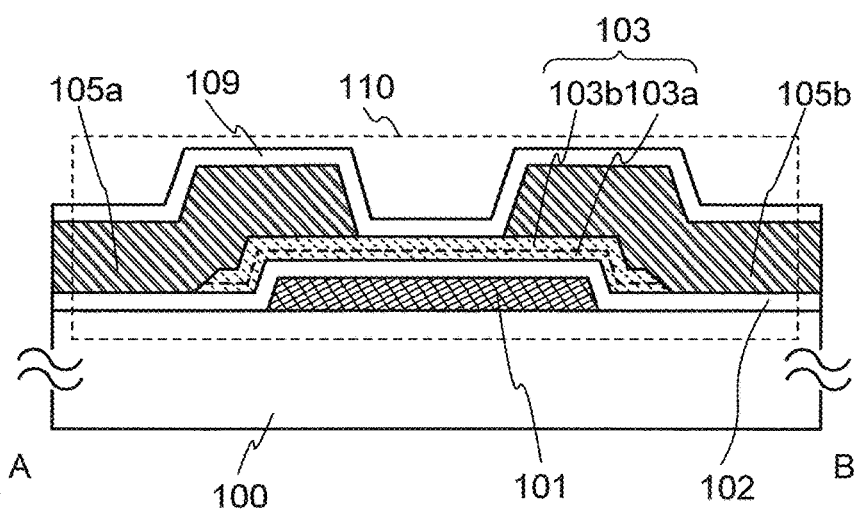

In FIGS. 1A and 1B, a plan view and a cross-sectional view of a channel-etched type transistor, which has a bottom-gate structure, are shown as an example of a semiconductor device. FIG. 1A is a plan view and FIG. 1B is a cross-sectional view taken along line A-B in FIG. 1A. In FIG. 1A, some of components (e.g., a protective insulating film 109 or the like) of a transistor 110 are omitted to avoid complexity.

The transistor 110 illustrated in FIGS. 1A and 1B includes, over a substrate 100 having an insulating surface, a gate electrode 101, a gate insulating film 102 covering the gate electrode 101, an oxide semiconductor film 103 provided to be in contact with the gate insulating film 102 and overlap with at least the gate electrode 101, a source electrode 105a and a drain electrode 105b electrically connected to the oxide semiconductor film 103, and the protective insulating film 109 covering the oxide semiconductor film 103 and the source electrode 105a and the drain electrode 105b.

The thickness of the oxide semiconductor film 103 is greater than 5 nm and less than or equal to 200 nm, preferably greater than or equal to 10 nm and less than or equal to 30 nm. Further, the oxide semiconductor film 103 preferably has a structure with crystallinity (e.g., a single crystal structure, a microcrystalline structure, or the like).

In this embodiment, the oxide semiconductor film 103 is preferably a c-axis aligned crystalline oxide semiconductor (CAAC-OS) film.

The CAAC-OS film is not completely single crystal or completely amorphous. The CAAC-OS film is an oxide semiconductor film with a crystal-amorphous mixed phase structure where crystal portions are included in an amorphous phase. Note that in most cases, the crystal portion fits inside a cube whose one side is less than 100 nm. From an observation image obtained with a transmission electron microscope (TEM), a boundary between an amorphous region and a crystal region in the CAAC-OS film is not clear. Further, with the TEM, a grain boundary in the CAAC-OS film cannot be found. Thus, in the CAAC-OS film, a reduction in electron mobility, due to the grain boundary, is suppressed.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of an a-axis and a b-axis of one crystal portion may be different from those of another crystal portion. In this specification and the like, a simple term "perpendicular" includes a range from 85° to 95°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases.

Since the c-axes of the crystal portions included in the CAAC-OS film are aligned in the direction perpendicular to a surface where the CAAC-OS film is formed or a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction perpendicular to the surface where the CAAC-OS film is formed or the surface of the CAAC-OS film. The crystal portion is formed by film formation or by performing treatment for crystallization such as heat treatment after film formation.

With use of the CAAC-OS film in a transistor, change in electric characteristics of the transistor due to irradiation with visible light or ultraviolet light can be reduced. Change and variation in threshold voltages can be suppressed. Thus, the transistor has high reliability.

In an oxide semiconductor having crystallinity (crystalline oxide semiconductor), defects in the bulk can be further reduced. Further, when planarity of the surface of the crystalline oxide semiconductor film is enhanced, a transistor including such an oxide semiconductor can obtain higher field-effect mobility than a transistor including an amorphous oxide semiconductor. In order to enhance the surface planarity of the oxide semiconductor film, the oxide semiconductor is preferably formed over a flat surface. Specifically, the oxide semiconductor is preferably formed over a surface with an average surface roughness ($R_a$) less than or equal to 0.15 nm, preferably less than or equal to 0.1 nm.

Note that the average surface roughness ($R_a$) is obtained by expanding, into three dimensions, arithmetic mean surface roughness that is defined by JIS B 0601:2001 (ISO4287:1997) so as to be able to apply it to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

Here, the specific surface is a surface that is a target of roughness measurement, and is a quadrilateral region specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

As illustrated in FIG. 1B, an end portion of the oxide semiconductor film 103 is preferably tapered at an angle of 20° to 50°. When the oxide semiconductor film 103 has a perpendicular end portion, oxygen is more likely to be released from the oxide semiconductor film 103, and accordingly, oxygen vacancies are likely to be generated. When the oxide semiconductor film 103 has a tapered end portion, generation of oxygen vacancies is suppressed, and thus generation of leakage current of the transistor 110 can be reduced.

An oxide semiconductor used for the oxide semiconductor film 103 preferably contains at least indium (In) or zinc (Zn). In particular, In and Zn are preferably contained. In addition, as a stabilizer for reducing variation in electric characteristics of a transistor using the oxide semiconductor, one or more selected from gallium (Ga), tin (Sn), hafnium (Hf), zirconium (Zr), titanium (Ti), scandium (Sc), yttrium (Y), and an lanthanoid element (such as cerium (Ce), neodymium (Nd), or gadolinium (Gd), for example) is preferably contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ (n>0, n is a natural number) may be used.

For example, an In—Ga—Zn-based oxide with an atomic ratio of In:Ga:Zn=1:1:1, In:Ga:Zn=3:1:2, or In:Ga:Zn=2:1:3, or any of oxides whose composition is in the neighborhood of the above compositions can be used.

For the gate insulating film 102, an oxide insulating film having a sufficient withstand voltage and sufficient insulating properties is preferably used. In the case where the gate insulating film 102 has a single-layer structure, an insulating film including oxidized material containing silicon, such as silicon oxide, may be used for example.

Alternatively, the gate insulating film 102 may have a stacked structure. In the case where the gate insulating film 102 has a stacked structure, silicon oxide may be stacked over gallium oxide, aluminum oxide, silicon nitride, silicon oxynitride, aluminum oxynitride, yttrium oxide, lanthanum oxide, silicon nitride oxide, or the like. Alternatively, silicon oxide may be stacked over a high-k material such as hafnium oxide, hafnium silicate ($HfSi_xO_y$ (x>0, y>0)), hafnium silicate to which nitrogen is added ($HfSiO_xN_y$ (x>0, y>0)), or hafnium aluminate ($HfAl_xO_y$ (x>0, y>0)). The use of such a high-k material enables a reduction in gate leakage current.

In the case of using an oxide insulating film as the gate insulating film 102, part of contained oxygen can be released from the oxide insulating film when the oxide insulating film is heated; thus, oxygen can be supplied to the oxide semiconductor film 103, and oxygen vacancies in the oxide semiconductor film 103 can be filled. In particular, the gate insulating film 102 preferably contains a large amount of oxygen which exceeds at least the stoichiometry in (a bulk of) the film. For example, a film of silicon oxide represented by the formula $SiO_{2+\alpha}$ ($\alpha$>0) is preferably used as the gate insulating film 102. When such a silicon oxide film is used as the gate insulating film 102, oxygen can be supplied to the oxide semiconductor film 103, so that the transistor 110 using the oxide semiconductor film 103 can have favorable transistor characteristics.

However, in the case of using a silicon oxide film as the gate insulating film 102, silicon in the gate insulating film 102 might be taken as an impurity into the oxide semiconductor film 103. Silicon or the like enters the oxide semiconductor film 103 and serves as an impurity, which affects characteristics of the transistor. Further, when an impurity element enters the oxide semiconductor film 103 in the vicinity of the surface on which the oxide semiconductor film 103 is formed (formed film surface), crystallization of an oxide semiconductor film is inhibited by the impurity element. Thus, an amorphous region is left in the oxide semiconductor film in the vicinity of the formed film surface. In addition, in the case where the oxide semiconductor film 103 is a CAAC-OS film, it is difficult to form a crystal portion in the vicinity of the formed film surface.

In particular, impurities such as silicon are likely to enter the oxide semiconductor film 103 in the vicinity of the formed film surface where the oxide semiconductor film 103 and the gate insulating film 102 are in contact with each other. A channel formation region of the transistor 110 is formed in the oxide semiconductor film 103 in the vicinity of the formed film surface; thus, when impurities such as silicon enter the vicinity of the formed film surface, characteristics of the transistor 110 might be changed.

Change in structure of the oxide semiconductor film 103 when $SiO_2$, oxidized material containing silicon, is added as an impurity was examined by classical molecular dynamics calculation. The results thereof are described with reference to FIGS. 21A and 21B, FIGS. 22A and 22B, FIG. 23, FIGS. 24A and 24B, and FIG. 25. Note that simulation software "SCIGRESS ME" manufactured by Fujitsu Limited was used for classical molecular dynamics calculation. An empirical potential which characterizes the interaction between atoms is defined in the classical molecular dynamics method, so that force that acts on each atom is evaluated. Newton's equation of motion is numerically solved, whereby motion (time-dependent change) of each atom can be deterministically tracked.

Hereinafter, calculation models and calculation conditions are described. Note that in this calculation, the Born-Mayer-Huggins potential was used.

A single crystal structure of InGaZnO$_4$ including 1680 atoms (see FIG. 21A) and a structure of InGaZnO$_4$ including 1680 atoms in which 20 atoms of each of In, Ga, and Zn are substituted by silicon (Si) atoms (see FIG. 21B) were formed as calculation models. In the model of Si substitution shown in FIG. 21B, silicon atoms are included at 3.57 at. % (2.34 wt. %). Further, the density of the model of the single crystal shown in FIG. 21A is 6.36 g/cm$^3$, and the density of the model of Si substitution shown in FIG. 21B is 6.08 g/cm$^3$.

Figure 21A:
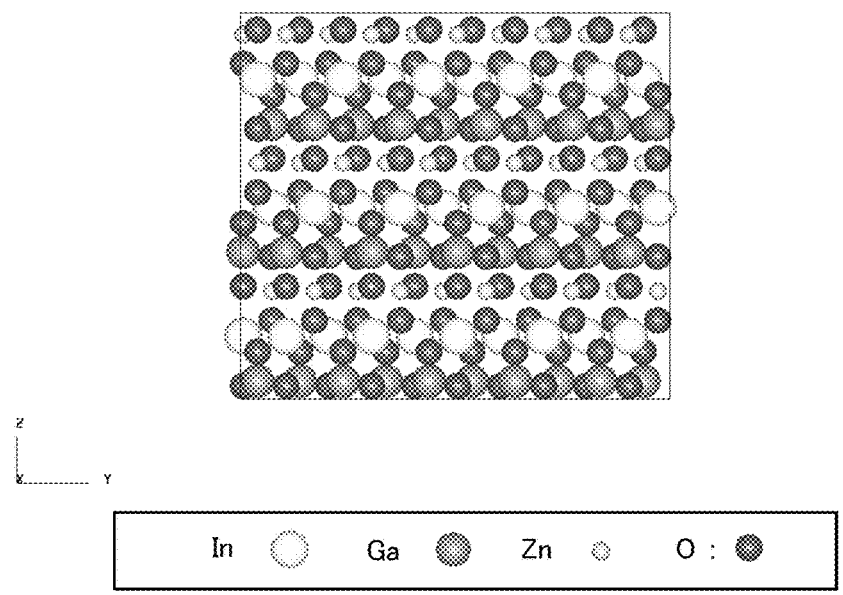
FIGS. 21A and 21B are model diagrams used for calculation.
Figure 21B:
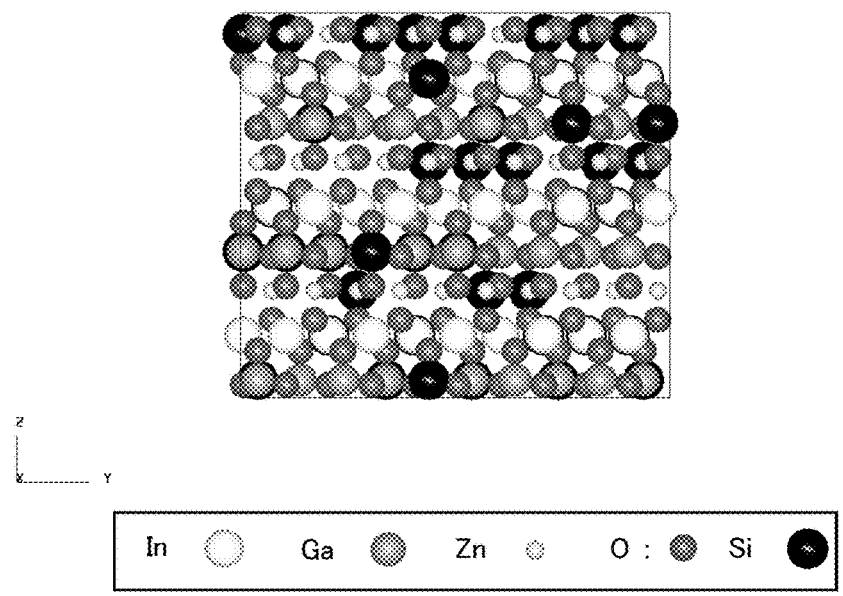

At 1727° C. which is lower than the melting point of the InGaZnO$_4$ single crystal (about 2000° C. according to estimation by the classical molecular dynamics calculation), structure relaxation was performed on the calculation models shown in FIGS. 21A and 21B by the classical molecular dynamics calculation at a fixed pressure (1 atm) for 150 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) becomes closer to 1.

Figure 22A:
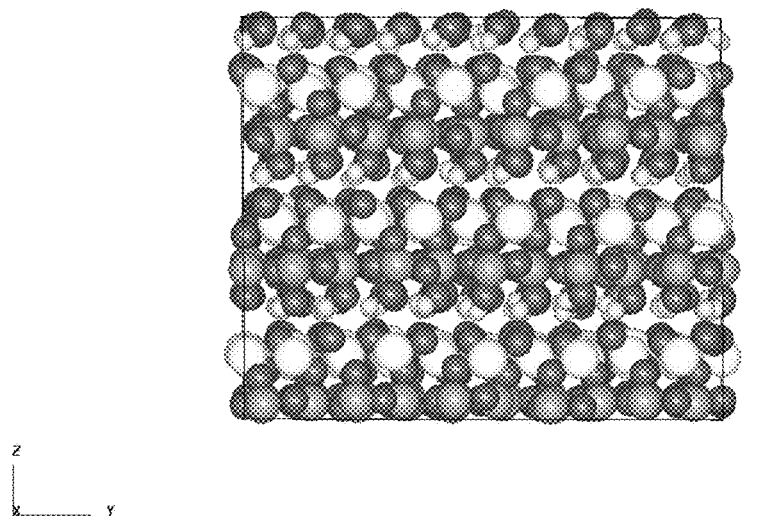
FIGS. 22A and 22B are model diagrams used for calculation.
Figure 22B:
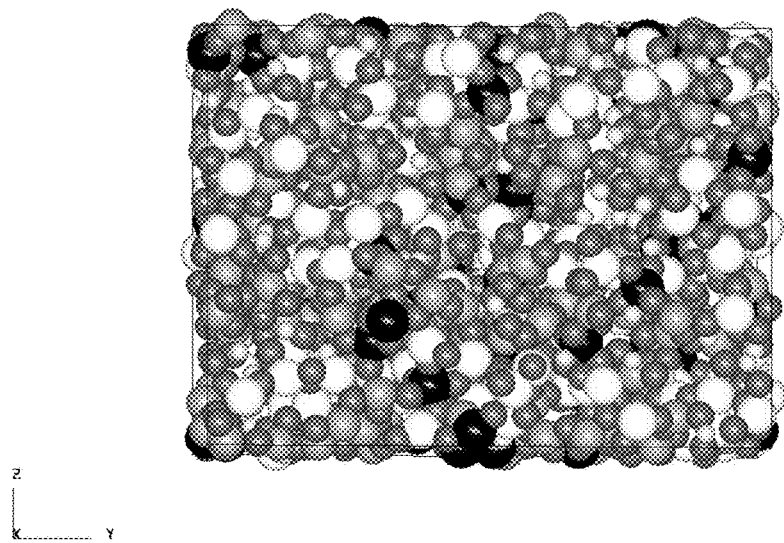
Figure 23:
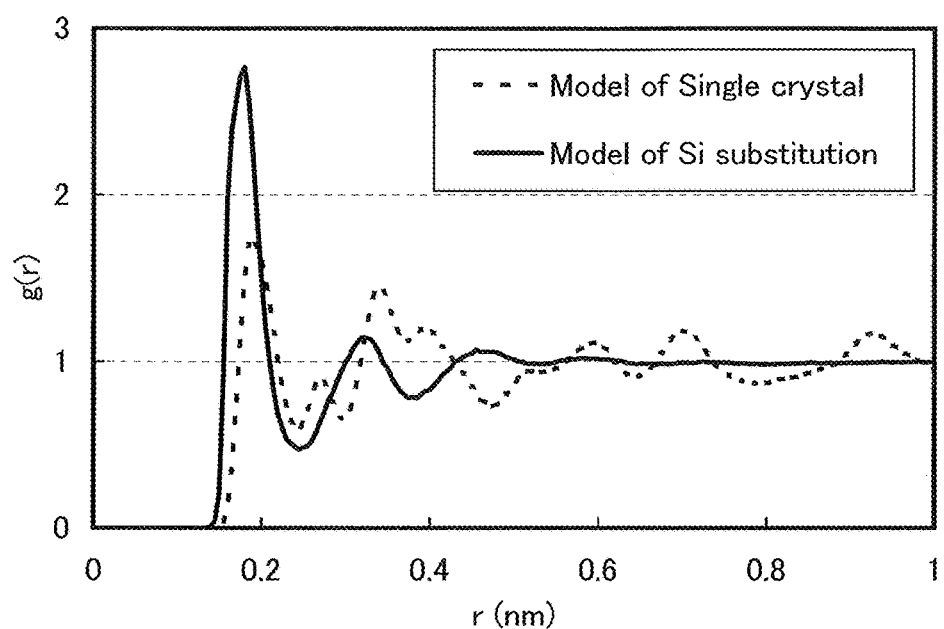
FIG. 23 shows calculation results.

FIGS. 22A and 22B show final structures obtained by performing the classical molecular dynamics calculation for 150 psec on the above two calculation models. In addition, FIG. 23 shows the radial distribution function g (r) in each structure.

The model of single crystal shown in FIG. 22A is stable and keeps the crystal structure even in the final structure, whereas the model of Si substitution shown in FIG. 22B is unstable, and it can be observed that the crystal structure is distorted with time and changes into an amorphous structure. When the radial distribution functions g(r) of the structural models are compared with each other in FIG. 23, it is found that the single crystal model has peaks even at a long distance and has a long-range order. On the other hand, it is found that in the model of Si substitution, the peak disappears at a distance about 0.6 nm, and the model of Si substitution does not have the long-range order.

The above calculation results indicate that when silicon (Si) is included in InGaZnO$_4$, InGaZnO$_4$ is likely to become amorphous. Further, according to the above results, even when InGaZnO$_4$ including silicon (Si) is heated at high temperature, such InGaZnO$_4$ is not crystallized.

Next, change in structure of the oxide semiconductor film 103 when carbon atoms (C) are added was examined by classical molecular dynamics calculation. The results thereof are described with reference to FIG. 21A, FIGS. 24A and 24B, and FIG. 25. Note that simulation software "SCIGRESS ME" manufactured by Fujitsu Limited was used for classical molecular dynamics calculation.

Calculation models and calculation results are as follows. Note that in this calculation, the Born-Mayer-Huggins potential was used. Further, for the interaction between carbon atoms (C), a Lennard-Jones potential was used.

A single crystal structure of InGaZnO$_4$ including 1680 atoms (see FIG. 21A) and a structure of InGaZnO$_4$ including 1680 atoms in which 20 atoms of each of In, Ga, and Zn are substituted by carbon atoms (C) and 80 atoms of oxygen (O) are substituted by carbon atoms (C) (see FIG. 24A) were formed as calculation models. In the model of C substitution shown in FIG. 24A, carbon atoms (C) are included at 8.33 at. %. Further, the density of the model of the single crystal shown in FIG. 21A is 6.36 g/cm$^3$, and the density of the model of C substitution shown in FIG. 24A is 5.89 g/cm$^3$.

Figure 24A:
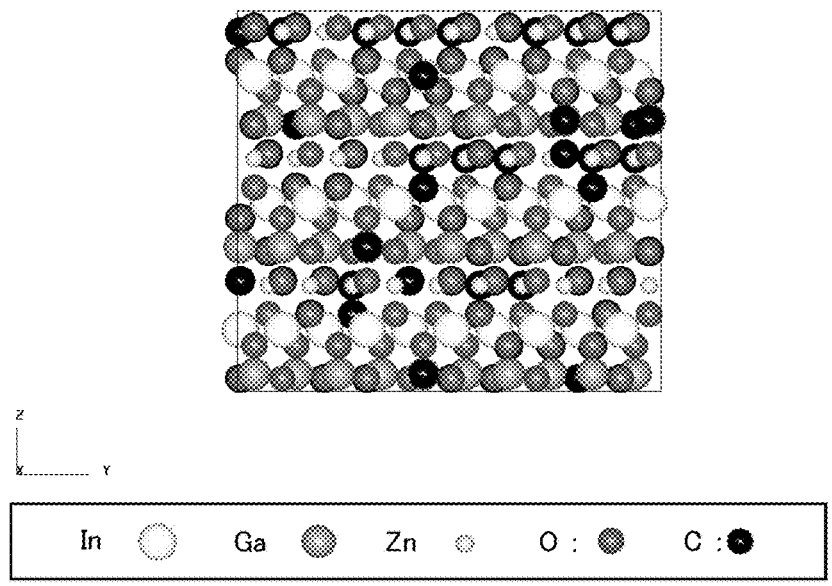
FIGS. 24A and 24B are model diagrams used for calculation.

At 1727° C. which is lower than the melting point of the InGaZnO$_4$ single crystal (about 2000° C. according to estimation by the classical molecular dynamics calculation), structure relaxation was performed on the calculation models shown in FIG. 21A and FIG. 24A by the classical molecular dynamics calculation at a fixed pressure (1 atm) for 140 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) becomes closer to 1.

Figure 24B:
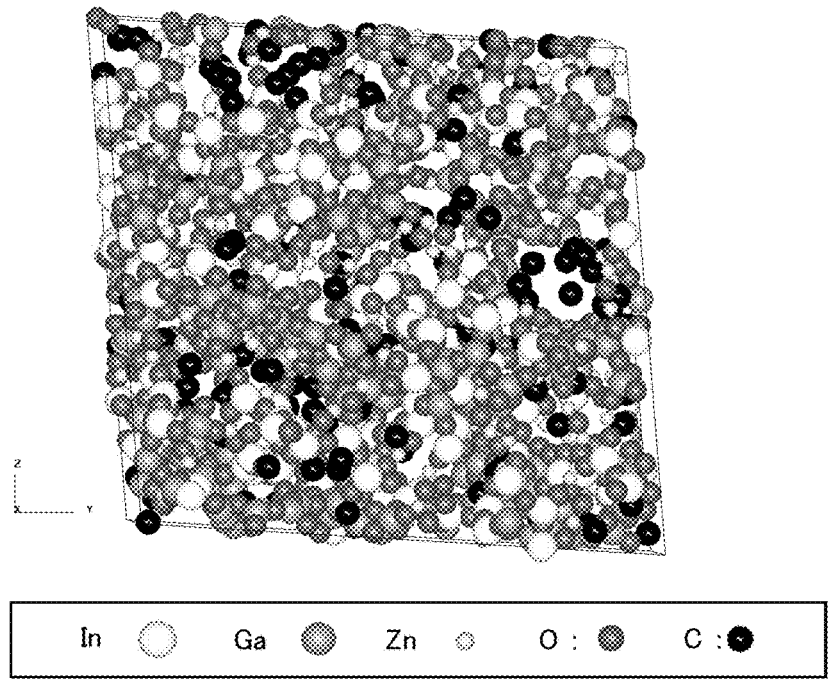
Figure 25:
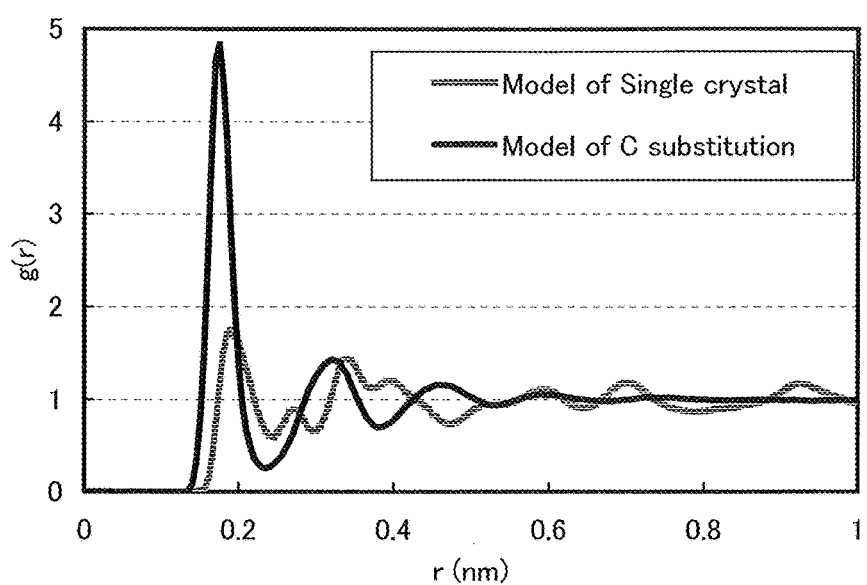
FIG. 25 shows calculation results.

FIG. 22A and FIG. 24B show final structures obtained by performing the classical molecular dynamics calculation for 150 psec on the above two calculation models. The radial distribution function g(r) in each structure is shown in FIG. 25.

The model of single crystal shown in FIG. 22A is stable and keeps the crystal structure even in the final structure, whereas the model of C substitution shown in FIG. 24B is unstable, and it can be observed that the crystal structure is distorted with time and changes into an amorphous structure. As seen in FIG. 25, by comparing the radial distribution functions g(r) of the structural models with each other, it is found that the model of single crystal has peaks even at a long distance and the long-range order. On the other hand, it is found that in the model of C substitution, the peak disappears at a distance about 0.6 nm, and the model of C substitution does not have the long-range order.

The above calculation results indicate that when carbon (C) is included in InGaZnO$_4$, InGaZnO$_4$ is likely to become amorphous. In addition, according to the above results, even when InGaZnO$_4$ including carbon (C) is heated at high temperature, such InGaZnO$_4$ is not crystallized.

As described above, entry of impurities into the oxide semiconductor film causes a reduction in crystallinity of the oxide semiconductor film. Thus, in the semiconductor device shown in this embodiment, entry of impurities such as silicon into the oxide semiconductor film in the vicinity of the formed film surface is suppressed. As a result, in the oxide semiconductor film 103, a region in which a concentration of silicon distributed from an interface with the gate insulating film 102 toward an inside of the oxide semiconductor film 103 is lower than or equal to 1.0 at. % is formed. Such a region is referred to as a region 103a. The concentration of silicon included in the region 103a is further preferably lower than or equal to 0.1 at. %. Further, the region 103a is provided to be in contact with the gate insulating film 102 and have a thickness less than or equal to 5 nm.

Note that a region in the oxide semiconductor film 103 other than the region 103a is referred to as a region 103b. The concentration of silicon included in the region 103b is lower than the concentration of silicon included in the region 103a.

Further, in the case where impurities such as carbon is included in the gate insulating film 102, such impurities might also enter the oxide semiconductor film 103 and serve as impurities, as in the case of silicon. In that case, the concentration of carbon included in the region 103a is lower than or equal to 1.0×10$^{20}$ atoms/cm$^3$, preferably lower than or equal to 1.0×10$^{19}$ atoms/cm$^3$.

As described above, the concentration of impurities such as silicon entering the region 103a in the oxide semiconductor film 103 is reduced, whereby change in characteristics of the transistor 110 can be suppressed. In addition, crystallization of the oxide semiconductor film 103 can be progressed in the vicinity of the formed film surface. Further, in the case where the oxide semiconductor film 103 is a CAAC-OS film, a crystal portion can be formed even in the vicinity of the formed film surface. When transistors using such oxide semiconductor films are manufactured, a semiconductor device with stable electric characteristics can be obtained.

Note that the details of the other components of the transistor are described in description of a method for manufacturing the transistor 110 below, with reference to FIGS. 4A to 4E.

Over the transistor 110, a planarity insulating film may be further formed. Further, openings may be formed in the gate insulating film 102, the protective insulating film 109, and the like in order that the source electrode 105a and the drain electrode 105b may be electrically connected to a wiring. Furthermore, a second gate electrode may further be provided above the oxide semiconductor film 103 to overlap with the gate electrode 101.

Figure 2A:
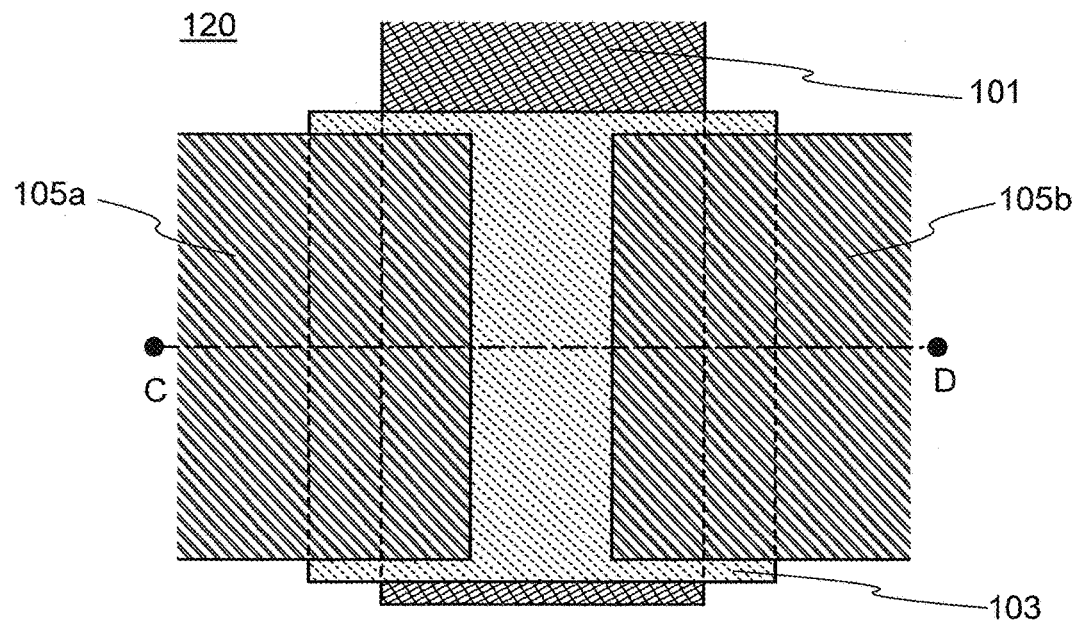
FIGS. 2A and 2B are a plan view and a cross-sectional view illustrating one embodiment of a semiconductor device.
Figure 2B:
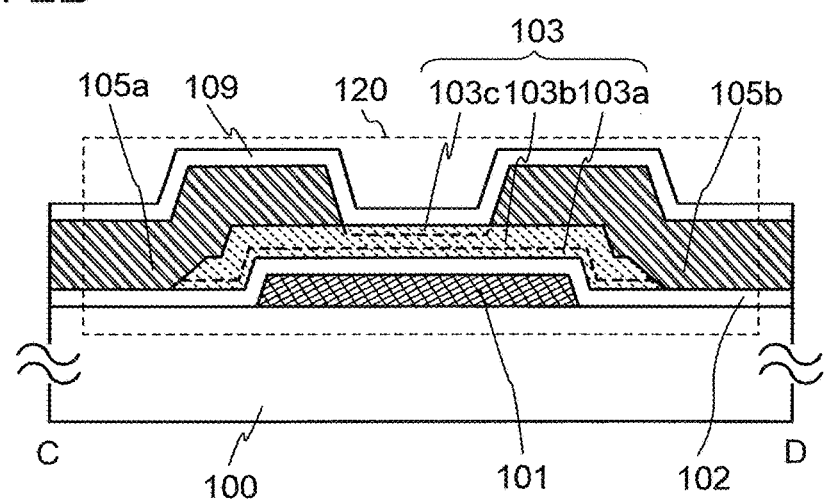

FIGS. 2A and 2B illustrate a transistor 120 having a different structure from that of the transistor 110 illustrated in FIGS. 1A and 1B. FIG. 2A is a plan view, and FIG. 2B is a cross-sectional view taken along C-D line in FIG. 2A. Note that part of components of the transistor 120 (e.g., the protective insulating film 109 and the like) is not illustrated in FIG. 2A for brevity.

The transistor 120 illustrated in FIGS. 2A and 2B includes, over a substrate 100 having an insulating surface, a gate electrode 101, a gate insulating film 102 covering the gate electrode 101, an oxide semiconductor film 103 provided to be in contact with the gate insulating film 102 and overlap with at least the gate electrode 101, a source electrode 105a and a drain electrode 105b electrically connected to the oxide semiconductor film 103, and a protective insulating film 109 covering the oxide semiconductor film 103 and the source electrode 105a and the drain electrode 105b. A difference between the transistor 120 and the transistor 110 is that like the gate insulating film 102, an insulating film including oxidized material containing silicon is used as the protective insulating film 109 and that a region 103c is provided in the vicinity of an interface between the oxide semiconductor film 103 and the protective insulating film 109.

The oxide semiconductor film 103 in the transistor 120 includes a region 103a, a region 103b, and the region 103c. The region 103a in the oxide semiconductor film 103 is a region where a concentration of silicon distributed from the interface with the gate insulating film 102 toward the inside of the oxide semiconductor film 103 is lower than or equal to 1.0 at. %. The region 103a is preferably provided to be in contact with the gate insulating film 102 and have a thickness less than or equal to 5 nm. The region 103c in the oxide semiconductor film 103 is a region where a concentration of silicon distributed from the interface with the protective insulating film 109 toward the inside of the oxide semiconductor film 103 is lower than or equal to 1.0 at. %. The region 103c is preferably provided to be in contact with the protective insulating film 109 and have a thickness less than or equal to 5 nm. In the oxide semiconductor film 103, a region between the region 103a and the region 103c is a region 103b.

Note that the concentration of silicon included in the region 103b is lower than that of silicon included in the region 103a. The concentration of silicon included in the region 103a is further preferably lower than or equal to 0.1 at. %.

Here, the concentration of silicon included in the region 103a is lower than or equal to 1.0 at. %, preferably lower than or equal to 0.1 at. %, and the concentration of silicon included in the region 103c is also lower than or equal to 1.0 at. %, preferably lower than or equal to 0.1 at. %. At this time, the concentration of silicon included in the region 103b is lower than the concentrations of silicon included in the region 103a and the region 103c.

As described above, also in the region 103c corresponding to a back channel of the oxide semiconductor film 103, the concentration of impurities such as silicon is reduced, so that change in electric characteristics of the transistor 120 can be suppressed.

The other components are same as those of the semiconductor device illustrated in FIGS. 1A and 1B; thus, the description on FIGS. 1A and 1B can be referred to for the details.

Figure 3A:
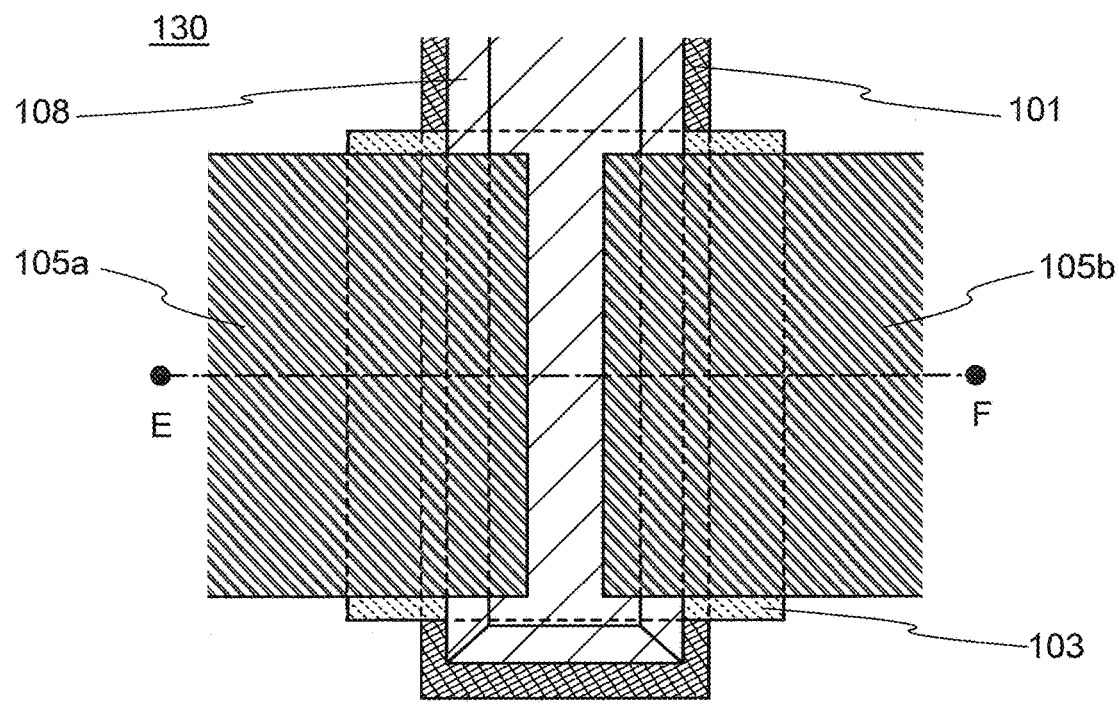
FIGS. 3A and 3B are a plan view and a cross-sectional view illustrating one embodiment of a semiconductor device.
Figure 3B:
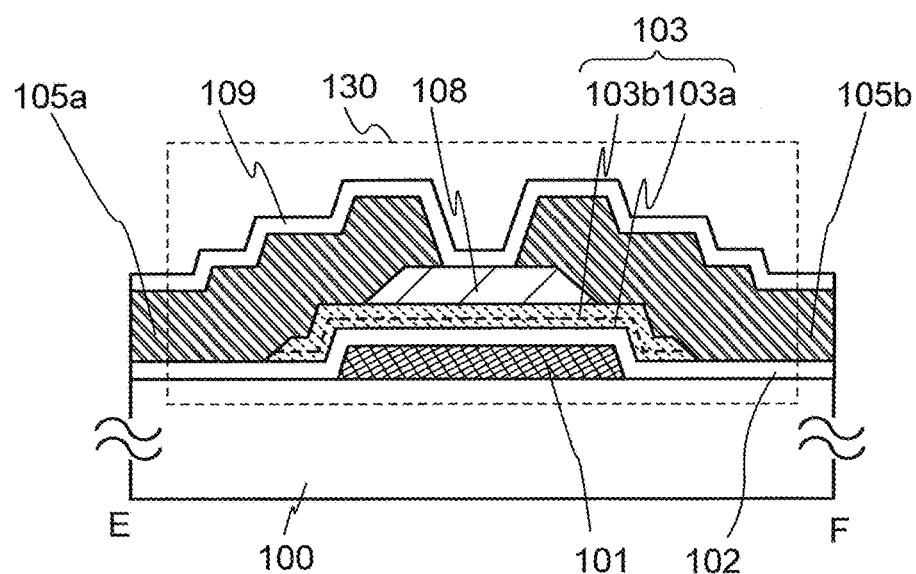

Although the transistors illustrated in FIGS. 1A and 1B and FIGS. 2A and 2B are so-called channel-etched type transistors, semiconductor devices shown in this embodiment are not limited thereto. FIGS. 3A and 3B illustrate a channel-stop type transistor 130, which is different from the transistors illustrated in FIGS. 1A and 1B and FIGS. 2A and 2B. FIG. 3A is a plan view, and FIG. 3B is a cross-sectional view taken along line E-F in FIG. 3A. Note that part of components of the transistor 130 (e.g., the protective insulating film 109 and the like) is not illustrated in FIG. 3A to avoid complexity. Further, in FIG. 3A, a channel protective film 108 is three-dimensionally illustrated for easy understanding.

The transistor 130 illustrated in FIGS. 3A and 3B includes, over a substrate 100 having an insulating surface, a gate electrode 101, a gate insulating film 102 covering the gate electrode 101, an oxide semiconductor film 103 provided to be in contact with the gate insulating film 102 and overlap with at least the gate electrode 101, the channel protective film 108 provided over and in contact with the oxide semiconductor film 103, a source electrode 105a and a drain electrode 105b which are provided over the channel protective film 108 and electrically connected to the oxide semiconductor film 103, and a protective insulating film 109 covering the oxide semiconductor film 103 and the source electrode 105a and the drain electrode 105b. In addition, as in the case of the transistor 110, the oxide semiconductor film 103 includes a region 103a and a region 103b. In other words, a difference from the transistor 110 is that the transistor 130 includes the channel protective film 108.

As the channel protective film 108, an inorganic insulating film containing oxygen is preferably used. For example, an insulating film such as a silicon oxide film, a silicon oxynitride film, an aluminum oxide film, an aluminum oxynitride film, a gallium oxide film, or a hafnium oxide film can be used. The preferable thickness of the channel protective film 108 is greater than or equal to 5 nm and less than or equal to 300 nm.

The channel protective film 108 is provided over and in contact with the oxide semiconductor film 103 as described, whereby damage on the oxide semiconductor film 103 on the back channel side, which is caused by etching the source electrode 105a and the drain electrode 105b (e.g., damage caused by plasma or an etchant in etching treatment), can be prevented. Thus, the transistor 130 can obtain stable electric characteristics.

Further, as illustrated in FIG. 3B, an end portion of the channel protective film 108 has a taper angle greater than or equal to 10° and less than or equal to 60°. The channel protective film 108 is formed to have such a shape, whereby the electric field concentration in the vicinity of a lower end portion of the channel protective film 108 can be relaxed.

The other components are the same as those in the semiconductor device illustrated in FIGS. 1A and 1B; thus, the description on FIGS. 1A and 1B can be referred to for the details.

<Example of Manufacturing Process of Transistor>

Examples of a manufacturing process of the transistor in FIGS. 1A and 1B, FIGS. 2A and 2B, and FIGS. 3A and 3B will be described below with reference to FIGS. 4A to 4E and FIGS. 5A to 5E.

<Manufacturing Process of Transistor 110>

An example of a manufacturing process of the transistor 110 in FIGS. 1A and 1B will be described with reference to FIGS. 4A to 4E.

First, the substrate 100 having an insulating surface is prepared. There is no particular limitation on a substrate that can be used as the substrate 100 having an insulating surface as long as it has at least heat resistance to withstand heat treatment performed later. For example, a glass substrate of barium borosilicate glass, aluminoborosilicate glass, or the like, a ceramic substrate, a quartz substrate, or a sapphire substrate can be used. As long as the substrate 100 has an insulating surface, a single crystal semiconductor substrate or a polycrystalline semiconductor substrate of silicon, silicon carbide, or the like; a compound semiconductor substrate of silicon germanium or the like; an SOI substrate; or the like can be used.

A flexible substrate may alternatively be used as the substrate 100. When a flexible substrate is used, a transistor including the oxide semiconductor film 103 may be directly formed over the flexible substrate. Alternatively, a transistor including the oxide semiconductor film 103 may be formed over a manufacturing substrate, and then, the transistor may be separated and transferred to a flexible substrate. Note that in order to separate the transistor from the manufacturing substrate and transfer it to the flexible substrate, a separation layer may be provided between the manufacturing substrate and the transistor including the oxide semiconductor film 103.

An insulating film functioning as a base film may be provided between the substrate 100 and the gate electrode 101. The base film has a function of preventing diffusion of impurities such as hydrogen or moisture from the substrate 100, and can be formed to have a single layer or stacked structure using one or more films selected from a silicon nitride film, a silicon oxide film, a silicon nitride oxide film, and a silicon oxynitride film.

Next, a conductive film used for formation of a gate electrode (as well as a wiring formed in the same layer as the gate electrode) is formed over the substrate 100. The conductive film used for the gate electrode can be formed using, for example, a metal material such as molybdenum, titanium, tantalum, tungsten, aluminum, copper, neodymium, or scandium, or an alloy material including any of these materials as a main component. Alternatively, the conductive film used for the gate electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), indium zinc oxide ($In_2O_3$—ZnO), or any of these metal oxide materials in which silicon or silicon oxide is included can be used. The gate electrode can be formed to have a single layer or a stacked structure using any of the above materials. There is no particular limitation on the method for forming the conductive film, and a variety of film formation methods such as an evaporation method, a CVD method, a sputtering method, or a spin coating method can be employed.

Next, a resist mask is formed over the conductive film through a photolithography step and selective etching is performed, so that the gate electrode 101 is formed. Then, the resist mask is removed. The resist mask used for forming the gate electrode 101 may be formed by an inkjet method. Formation of the resist mask by an inkjet method needs no photomask; thus, manufacturing cost can be reduced. For etching the gate electrode 101, wet etching, dry etching, or both of them may be employed.

Figure 4A:
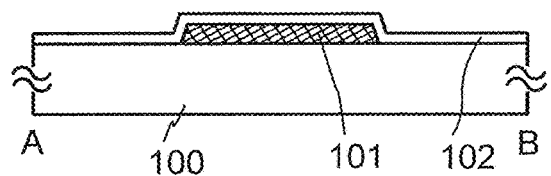
FIGS. 4A to 4E are cross-sectional views illustrating an example of a manufacturing process of a semiconductor device.

Next, the gate insulating film 102 is formed to cover the gate electrode 101 (see FIG. 4A). The gate insulating film 102 can have a thickness greater than or equal to 1 nm and less than or equal to 500 nm, for example. There is no particular limitation on the method for forming the gate insulating film 102; for example, a sputtering method, an MBE method, a CVD method, a pulse laser deposition method, an ALD method, or the like can be used as appropriate for formation of the gate insulating film 102.

For the gate insulating layer 102, an oxide insulating film having a sufficient withstand voltage and a sufficient insulating property is preferably used. In the case where the gate insulating film 102 has a single-layer structure, an insulating film including oxidized material containing silicon, such as a silicon oxide film, may be used.

Alternatively, the gate insulating film 102 may have a stacked structure. In the case where the gate insulating film 102 has a stacked structure, silicon oxide may be stacked over gallium oxide, aluminum oxide, silicon nitride, silicon oxynitride, aluminum oxynitride, yttrium oxide, lanthanum oxide, silicon nitride oxide, or the like. Alternatively, silicon oxide may be stacked over a high-k material such as hafnium oxide, hafnium silicate ($HfSi_xO_y$, (x>0, y>0)), hafnium silicate to which nitrogen is added ($HfSiO_xN_y$, (x>0, y>0)), or hafnium aluminate ($HfAl_xO_y$, (x>0, y>0)). The use of such a high-k material enables a reduction in gate leakage current.

When an oxide insulating film is used as the gate insulating film 102, part of oxygen contained in the oxide insulating film can be released by performing heat treatment described later; thus, oxygen can be supplied to the oxide semiconductor film 103, and oxygen vacancies in the oxide semiconductor film 103 can be filled. In particular, the gate insulating film 102 preferably contains a large amount of oxygen which exceeds at least the stoichiometry in (a bulk of) the gate insulating film 102. For example, a film of silicon oxide represented by the formula $SiO_{2+\alpha}$, ($\alpha$>0) is preferably used as the gate insulating film 102. When such a silicon oxide film is used as the gate insulating film 102, oxygen can be supplied to the oxide semiconductor film 103, so that the transistor 110 using the oxide semiconductor film 103 can have favorable transistor characteristics.

Further, before the oxide semiconductor film 103 is formed, planarization treatment may be performed on the gate insulating film 102. Although not particularly limited, the planarization treatment can be dry etching, plasma treatment, polishing (e.g., chemical mechanical polishing (CMP)), or the like.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface where the oxide semiconductor film 103 is formed.

As the planarization treatment, polishing treatment, dry-etching treatment, or plasma treatment may be performed plural times and/or in combination. In the case where the treatments are combined, the order of steps is not particularly limited and may be set as appropriate in accordance with roughness of the surface where the oxide semiconductor film 103 is formed.

Further, in order that hydrogen or water may be contained in the oxide semiconductor film 103 as little as possible in a formation step of the oxide semiconductor film 103, it is preferable that the substrate 100 on which the gate insulating film 102 is already formed be preheated in a preheating chamber of a sputtering apparatus as pretreatment for formation of the oxide semiconductor film 103 so that impurities such as hydrogen and moisture adsorbed to the substrate 100 and the gate insulating film 102 are removed and evacuated. As an evacuation unit provided in the preheating chamber, a cryopump is preferable.

Figure 4B:
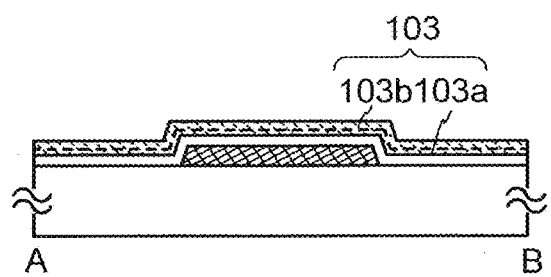

Next, over the gate insulating film 102, the oxide semiconductor film 103 having a thickness greater than 5 nm and less than or equal to 200 nm, preferably greater than or equal to 10 nm and less than or equal to 30 nm is formed (see FIG. 4B). The oxide semiconductor film 103 preferably has a structure with crystallinity of single crystal or microcrystal. Further, the oxide semiconductor film 103 is preferably a CAAC-OS film. Note that it is preferable that the gate insulating film 102 and the oxide semiconductor film 103 be formed successively without being exposed to air.

In this embodiment, as the oxide semiconductor film 103, an oxide semiconductor film is formed using an In—Ga—Zn-based oxide target by a sputtering method. Alternatively, the oxide semiconductor film 103 can be formed by a sputtering method in a rare gas (typically, argon) atmosphere, an oxygen atmosphere, or a mixed atmosphere of a rare gas and oxygen.

As a target used for forming an In—Ga—Zn—O film as the oxide semiconductor film 103 by a sputtering method, for example, an oxide target with an atomic ratio where In:Ga:Zn=1:1:1, an oxide target with an atomic ratio where In:Ga:Zn=3:1:2, or an oxide target with an atomic ratio where In:Ga:Zn=2:1:3 can be used. However, a material and composition of a target used for formation of the oxide semiconductor film 103 is not limited to the above.

The relative density of the oxide target is higher than or equal to 90% and lower than or equal to 100%, preferably higher than or equal to 95% and lower than or equal to 99.9%. By using the oxide target with high relative density, the oxide semiconductor film 103 can be a dense film.

It is preferable that a high-purity gas from which impurities such as hydrogen, water, a hydroxyl group, or a hydride is removed be used as the sputtering gas for the formation of the oxide semiconductor film 103.

There are three heating methods for forming a CAAC-OS film when the CAAC-OS film is used as the oxide semiconductor film 103. One of the methods (first method) is to form an oxide semiconductor film at a temperature higher than or equal to 200° C. and lower than or equal to 450° C. to form, in the oxide semiconductor film, crystal portions in which the c-axes are aligned in the direction perpendicular to a surface where the oxide semiconductor film is formed or a surface of the oxide semiconductor film. Another method (second method) is to form an oxide semiconductor film with a small thickness and then heat it at a temperature higher than or equal to 200° C. and lower than or equal to 700° C., to form, in the oxide semiconductor film, crystal portions in which the c-axes are aligned in the direction perpendicular to a surface where the oxide semiconductor film is formed or a surface of the oxide semiconductor film. The other method (third method) is to form a first oxide semiconductor film with a small thickness, then heat it at a temperature higher than or equal to 200° C. and lower than or equal to 700° C., and form a second oxide semiconductor film, to form, in the oxide semiconductor film, crystal portions in which the c-axes are aligned in the direction perpendicular to a surface where the oxide semiconductor film is formed or a surface of the oxide semiconductor film.

By heating the substrate 100 during film formation, the concentration of impurities such as hydrogen or water in the oxide semiconductor film 103 can be reduced. In addition, damage by sputtering can be reduced, which is preferable.

Note that when an oxide semiconductor film having crystallinity (single crystal or microcrystal) different from the CAAC-OS film is formed as the oxide semiconductor film 103, the film formation temperature is not particularly limited.

In the case where a CAAC-OS film is used as the oxide semiconductor film 103, for example, the CAAC-OS film is deposited by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while keeping their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

As an example of the sputtering target, a polycrystalline In—Ga—Zn-based oxide target is described below.

The In—Ga—Zn-based oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

Then, a sputtering gas from which hydrogen and moisture have been removed is introduced into the deposition chamber while moisture remaining therein is removed, and the oxide semiconductor film 103 is deposited over the substrate 100 with the use of the above target. In order to remove moisture remaining in the deposition chamber, an entrapment vacuum pump such as a cryopump, an ion pump, or a titanium sublimation pump is preferably used. Further, an evacuation unit may be a turbo pump provided with a cold trap. From the deposition chamber which is evacuated with a cryopump, a hydrogen atom, a compound containing a hydrogen atom such as water ($H_2O$) (more preferably, also a compound containing a carbon atom), and the like are removed, whereby the concentration of impurities such as hydrogen or moisture in the oxide semiconductor film 103 formed in the deposition chamber can be reduced.

Note that in the case where the oxide semiconductor film 103 is formed by a sputtering method, when a particle for forming the oxide semiconductor film 103 collides with the gate insulating film 102, an element that is a constituent element of the gate insulating film 102 enters the oxide semiconductor film 103 (this phenomenon is called mixing or mixing effect). Such a mixing phenomenon significantly occurs in the oxide semiconductor film 103 in the vicinity of the interface with the gate insulating film 102, specifically occurs in the above-described region 103a. Since in the transistor described in this embodiment, a channel region is formed in the oxide semiconductor film 103 in the vicinity of the gate insulating film 102, a constituent element of the gate insulating film 102, which enters the region and serves as an impurity therein, may be a cause of a reduction in on-state characteristics (e.g., on-state current) of the transistor.

The possibility of mixing occurring in the vicinity of an interface between the gate insulating film 102 and the oxide semiconductor film 103 when the oxide semiconductor film 103 is formed over the gate insulating film 102 was examined by classical molecular dynamics calculation. Here, the results thereof are described. Note that simulation software "SCIGRESS ME" manufactured by Fujitsu Limited was used for the calculation.

Figure 6:
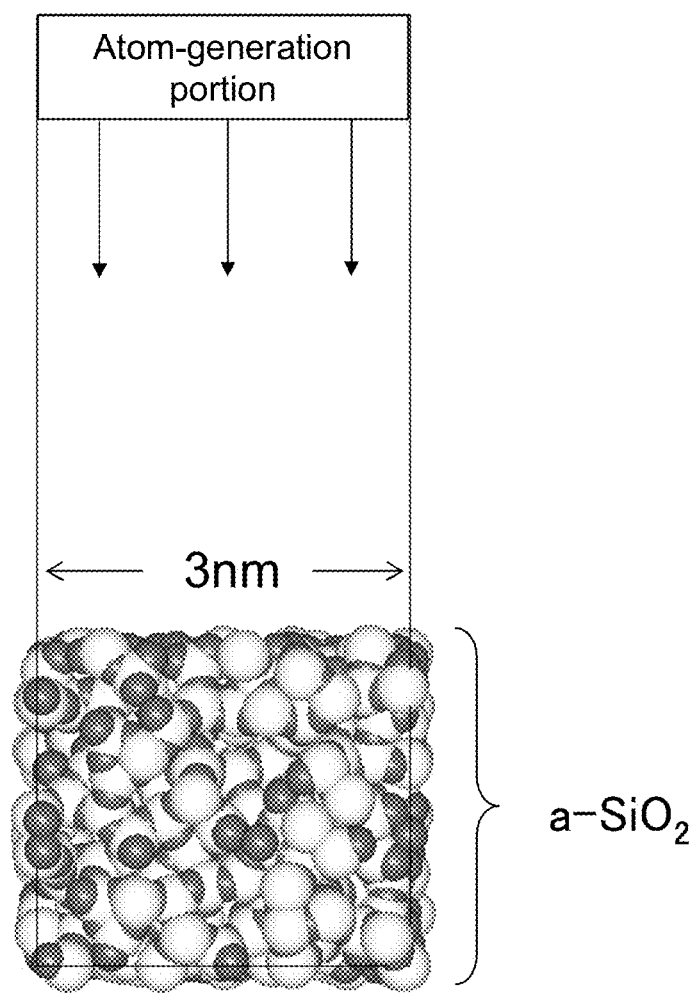
FIG. 6 is a model diagram used for calculation.

A model shown in FIG. 6 was formed using an amorphous silicon oxide (hereinafter, referred to as a-$SiO_2$) film as a gate insulating film. The size of a unit cell (a calculation unit cell) used in calculation is set to be 3 nm in the x-axis direction, 3 nm in the y-axis direction, and 7.5 nm in the z-axis direction. The x-axis and the y-axis refer to the directions parallel to the a-$SiO_2$ film, and the z-axis refers to the thickness direction of the a-$SiO_2$ film. Note that in the calculation, the periodic boundary condition is applied in the x-axis direction and the y-axis direction so that a film which is sufficiently large in the x-axis direction and the y-axis direction can be assumed.

Next, indium atoms, gallium atoms, zinc atoms, and oxygen atoms whose ratio is 1:1:1:4 (the total number of atoms is 840) were ejected from the upper portion (in FIG. 6, an atom-generation portion) over the a-$SiO_2$ film toward the lower portion, and classical molecular dynamics calculation was performed at a temperature of 300° C. for 2 nsec (the time step: 0.2 fs, the number of steps: ten million). Note that one atom has an energy of 1 eV.

FIGS. 7A to 7C and FIGS. 8A to 8C show the calculation results. FIG. 7A shows arrangement of oxygen atoms and silicon atoms at 0 sec; FIG. 7B shows arrangement of oxygen atoms, silicon atoms, gallium atoms, and zinc atoms after 1 nsec; and FIG. 7C shows arrangement of oxygen atoms, silicon atoms, gallium atoms, and zinc atoms after 2 nsec. FIG. 8A shows arrangement of oxygen atoms, silicon atoms, gallium atoms, and zinc atoms after 2 nsec; FIG. 8B shows arrangement of only silicon atoms after 2 nsec; and FIG. 8C shows arrangement of indium atoms, gallium atoms, and zinc atoms after 2 nsec.

By comparing the arrangement of only silicon atoms shown in FIG. 8B and the arrangement of indium atoms, gallium atoms, and zinc atoms shown in FIG. 8C, it was confirmed that the indium atoms, the gallium atoms, and the zinc atoms entered a layer of silicon atoms.

The above calculation results indicate that by injecting indium atoms, gallium atoms, zinc atoms, and oxygen atoms into the a-$SiO_2$ film, a layer in which silicon atoms, indium atoms, gallium atoms, zinc atoms, and oxygen atoms are mixed is formed between the a-$SiO_2$ film and an IGZO film. Note that one atom has an energy of 1 eV.

According to the above results, in order to prevent formation of a layer in which the oxide semiconductor film 103 and the gate insulating film 102 are mixed, it is effective to reduce an impact caused by collision of a particle for forming the oxide semiconductor film 103 with the gate insulating film 102. For achieving the above, a method in which the power for deposition of the oxide semiconductor film 103 is low or a method in which the pressure for deposition thereof is high can be used, for example. Alternatively, a distance between a target and a substrate over which the film is deposited (hereinafter, referred to as a T-S distance) may be increased.

Note that mixing caused by sputtering is likely to be generated in the oxide semiconductor film 103 in the vicinity of the interface with the gate insulating film 102 as described above. Thus, part of the oxide semiconductor film in the vicinity of the interface is deposited by sputtering under the condition that the impact caused by a particle for forming the oxide semiconductor film 103, which collides with the gate insulating film 102 is low, and accordingly the mixing effect is reduced; after that, in performing the rest of deposition, the impact of collision may be increased. For example, part of the oxide semiconductor film 103 in the vicinity of the interface may be deposited under the condition that the power for depositing the oxide semiconductor film 103 is low, and then, deposition of the oxide semiconductor film may be carried on under the condition that the deposition power is increased. Alternatively, part of the oxide semiconductor film 103 in the vicinity of the interface may be deposited under the condition that the pressure for depositing the oxide semiconductor film 103 is high, and then, deposition of the oxide semiconductor film may be carried on under the condition that the deposition pressure is reduced. Further alternatively, part of the oxide semiconductor film 103 in the vicinity of the interface may be deposited under the condition that the T-S distance is large, and then, deposition of the oxide semiconductor film may be carried on under the condition that the T-S distance is decreased.

The specific value of the deposition power is 5 kW or lower, preferably, 1 kW or lower, further preferably 500 W or lower, furthermore preferably, 200 W or lower. However, as the deposition power is reduced, the deposition rate of the oxide semiconductor film 103 is decreased. Further, in the case where the deposition power is significantly low, plasma is less likely to be generated in a sputtering apparatus, and the possibility that normal deposition treatment cannot be performed is increased. Thus, it is preferable that the deposition power be 5% (or higher) of the maximum power that can be applied in the sputtering apparatus. In considering a reduction in the deposition power, a practitioner may select the optimum power value as appropriate in terms of performance of the sputtering apparatus or the thickness of the oxide semiconductor film 103 so that deposition can be normally performed, as long as the manufacturing process of the transistor 110 (cycle time) is not significantly affected by the deposition time.

The specific value of the deposition pressure is 0.4 Pa or higher, preferably, 1.0 Pa or higher, further preferably 2.0 Pa or higher, furthermore preferably, 5.0 Pa or higher. However, as the deposition pressure is increased, quality of a film that is to be deposited tends to deteriorate (e.g., the film quality is sparse). Thus, it is preferable that the deposition pressure is 100 Pa or lower. In considering an increase in the deposition pressure, a practitioner may select the optimum pressure value as appropriate in terms of characteristics necessary for the oxide semiconductor film 103 (e.g., field-effect mobility or the like).

The specific value of the T-S distance is 30 mm or more, preferably 50 mm or more, further preferably 100 mm or more, furthermore preferably 300 mm or more. Note that as the T-S distance is extremely increased, the deposition rate of the oxide semiconductor film 103 is decreased. Thus, it is preferable that the T-S distance be 500 mm or less. In considering an increase in the T-S distance, a practitioner may select the optimum T-S distance as appropriate as long as the manufacturing process of the transistor 110 (cycle time) is not significantly affected by the deposition time.

Note that in order to reduce the impact of a particle for forming the oxide semiconductor film 103, which collides with the gate insulating film 102, the oxide semiconductor film 103 may be deposited in a state where one or more of the conditions of deposition power, deposition pressure, and T-S distance are set in the above range.

In the case where as the sputtering apparatus, a magnetron-type sputtering apparatus in which a target and a substrate over which a film is to be deposited are set in substantially parallel to each other (simply the apparatus is also called a magnetron sputtering apparatus) is used, besides a particle for forming the oxide semiconductor film 103, plasma, a secondary electron, or the like collides with the gate insulating film 102; thus, an element included in the gate insulating film 102 is more likely to enter the oxide semiconductor film 103. Therefore, as a sputtering apparatus used for depositing the oxide semiconductor film 103, a facing-target-type sputtering apparatus (also called mirror-tron sputtering apparatus) may be used. In the apparatus, two targets are set to face each other, a substrate over which a film is to be deposited is set in a portion other than a space sandwiched between the two targets to be in a direction substantially perpendicular to the targets. Then, high-density plasma is generated between the two targets facing each other, and surfaces of the targets (which are used for deposition of the oxide semiconductor film 103) are sputtered by the plasma, whereby the oxide semiconductor film 103 is deposited over the substrate. Thus, the substrate where a film is to be deposited is not (or hardly) exposed to plasma or a secondary electron directly.

Further, in the case where the oxide semiconductor film 103 is deposited by sputtering in a rare gas atmosphere, helium may be used instead of argon. When helium whose atomic weight is smaller than that of argon is used, the impact of a particle for forming the oxide semiconductor film 103, which collides with the gate insulating film 102, can be reduced. Furthermore, after part of the oxide semiconductor film 103 in the vicinity of the interface with the gate insulating film 102 is deposited in a helium atmosphere, the atmosphere in the deposition chamber is switched into an argon atmosphere, whereby the deposition rate of the oxide semiconductor film 103 can be increased.

Alternatively, the oxide semiconductor film 103 may be deposited by a method by which the impact on the gate insulating film 102 is small, such as an atomic layer deposition (ALD) method, an evaporation method, or a coating method.

As described above, the oxide semiconductor film 103 is deposited under the condition that the impact of a particle for forming the oxide semiconductor film 103, which collides with the gate insulating film 102 is reduced, so that in the oxide semiconductor film 103, the region 103a where a concentration of silicon distributed from an interface with the gate insulating film 102 toward the inside of the oxide semiconductor film 103 is lower than or equal to 1.0 at. % and the region 103b where silicon is lower than that in the region 103a are formed. Here, the region 103b indicates a region in the oxide semiconductor film 103 other than the region 103a. Further, the concentration of silicon included in the region 103a is preferably lower than or equal to 0.1 at. %.

Further, when the oxide semiconductor film 103 is deposited in such a manner, entry of impurities such as carbon included in the gate insulating film 102 into the oxide semiconductor film 103 can be also reduced. Thus, the concentration of carbon included in the region 103a is lower than or equal to $1.0 \times 10^{20}$ atoms/cm$^3$, preferably lower than or equal to $1.0 \times 10^{19}$ atoms/cm$^3$.

In the case where a CAAC-OS film is formed as the oxide semiconductor film 103 while being heated (the first method), the amount of impurities such as silicon entering the region 103a is reduced, so that a crystal portion in which a c-axis is aligned in a direction perpendicular to a formed film surface or a surface of the oxide semiconductor film can be formed even in the vicinity of the formed film surface of the CAAC-OS film.

Further, when the oxide semiconductor film 103 is deposited under the conduction that the impact of a particle for forming the oxide semiconductor film 103, which collides with the gate insulating film 102 is reduced, entry of the constituent element of the oxide semiconductor film 103 into the gate insulating film 102 can be suppressed. Thus, entry of the constituent element having high conductivity, such as a metal element, of the oxide semiconductor film 103 into the gate insulating film 102 can be suppressed, and accordingly, a reduction in resistivity of the gate insulating film 102 can be prevented.

After the oxide semiconductor film 103 is deposited, heat treatment may be performed on the oxide semiconductor film 103. The temperature of the heat treatment is higher than or equal to 200° C. and lower than or equal to 700° C., or lower than the strain point of the substrate. When the heat treatment is performed, excess hydrogen (including water and a hydroxyl group) can be removed.

In the case where a CAAC-OS film is formed by the second or third method, the above heat treatment is performed, so that a crystal portion in which a c-axis is aligned in a direction perpendicular to a formed film surface or a surface of the oxide semiconductor film can be formed. In addition, the concentration of impurities such as silicon is reduced in the region 103a in the oxide semiconductor film 103; thus, the crystal portion can be formed even in the vicinity of the formed film surface of the oxide semiconductor film 103.

The heat treatment can be performed in such a manner that, for example, an object to be processed is introduced into an electric furnace in which a resistance heater or the like is used and heated at 450° C. in a nitrogen atmosphere for one hour. During the heat treatment, the oxide semiconductor film 103 is not exposed to air to prevent entry of water and hydrogen.

The heat treatment apparatus is not limited to the electric furnace and may be an apparatus for heating an object by thermal radiation or thermal conduction from a medium such as a heated gas. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature exceeds the upper temperature limit of the object. Note that the inert gas may be switched to a gas containing oxygen during the process.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is less than or equal to 1 ppm, preferably less than or equal to 0.1 ppm).

In addition, after the oxide semiconductor film 103 is heated by the heat treatment, a high-purity oxygen gas, a dinitrogen monoxide gas, a high-purity dinitrogen monoxide gas, or ultra dry air (the moisture amount is less than or equal to 20 ppm (−55° C. by conversion into a dew point), preferably less than or equal to 1 ppm, or further preferably less than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably greater than or equal to 6N, further preferably greater than or equal to 7N (i.e., the impurity concentration in the oxygen gas or the dinitrogen monoxide gas is preferably less than or equal to 1 ppm, further preferably less than or equal to 0.1 ppm). By the effect of the oxygen gas or the dinitrogen monoxide gas, oxygen which is a main component of the oxide semiconductor and which has been reduced at the same time as the heat treatment is supplied, so that the oxide semiconductor film can be a high-purity and electrically i-type (intrinsic) oxide semiconductor film.

In the case where a CAAC-OS film is formed by the third method, an oxide semiconductor film may be additionally formed. Thus, the additionally formed oxide semiconductor film can also have a crystal portion with use of the crystal portion as a seed in which a c-axis is aligned in a direction perpendicular to the formed film surface or the surface of the oxide semiconductor film.

Note that in the case where an oxide semiconductor film having crystallinity (single crystal or microcrystalline) different from a CAAC-OS film is formed, by performing the heat treatment, the oxide semiconductor film can be crystallized. In addition, since the concentration of impurities such as silicon is reduced in the region 103a in the oxide semiconductor film 103, the oxide semiconductor film even in the vicinity of the formed film surface can be crystallized.

Note that the case is described here in which before the oxide semiconductor film is processed to have an island shape, the heat treatment is performed; however, one embodiment of the disclosed invention is not construed as being limited thereto. The heat treatment may be performed after the oxide semiconductor film is processed to have an island shape.

Figure 4C:
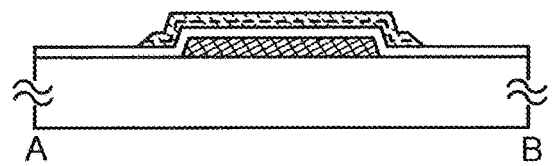

Next, the oxide semiconductor film 103 is preferably processed into the island-shape oxide semiconductor film 103 by a photolithography step (see FIG. 4C). A resist mask which is used in the formation of the island-shaped oxide semiconductor film 103 may be formed by an ink-jet method. Formation of the resist mask by an inkjet method needs no photomask; thus, manufacturing cost can be reduced. Note that etching of the oxide semiconductor film 103 may be dry etching, wet etching, or both dry etching and wet etching.

Here, as illustrated in FIG. 4C, an end portion of the oxide semiconductor film 103 preferably has a taper angle of 20° to 50°. When the oxide semiconductor film 103 has a perpendicular end portion, oxygen is easily released from the oxide semiconductor film 103. When the oxide semiconductor film 103 has a tapered end portion, generation of oxygen vacancies is suppressed, and thus generation of leakage current of the transistor 110 can be reduced.

Next, a conductive film used for a source electrode and a drain electrode (as well as a wiring formed in the same layer as the gate electrode) is formed over the oxide semiconductor film 103. As the conductive film used for the source electrode and the drain electrode, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, the conductive film may have a structure in which a film of a high-melting-point metal such as titanium, molybdenum, or tungsten, or a nitride film of any of these metals (a titanium nitride film, a molybdenum nitride film, or a tungsten nitride film) is stacked on either or both of the bottom surface and the top surface of a metal film of aluminum, copper, or the like. Further, the conductive film used for the source electrode and the drain electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO) can be used. The conductive film used for the source electrode and the drain electrode can be formed using any of the above materials to have a single layer or a stacked structure. There is no particular limitation on the method for forming the conductive film, and a variety of film formation methods such as an evaporation method, a CVD method, a sputtering method, or a spin coating method can be employed.

Figure 4D:
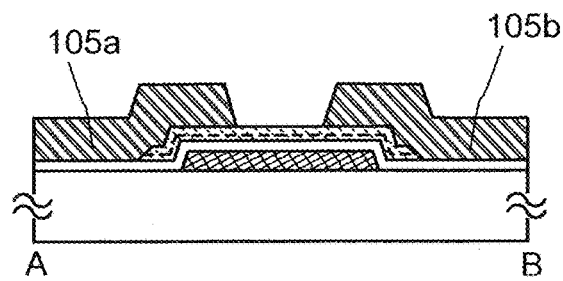

A resist mask is formed over the conductive film by a photolithography step, selective etching is performed so that the source electrode 105a and the drain electrode 105b are formed, and after that, the resist mask is removed (see FIG. 4D). For the light exposure for forming the resist mask in the photolithography step, ultraviolet, KrF laser, or ArF laser is preferably used. In this step, a channel length L of a transistor that is to be completed in a later step is determined by a distance between a lower end of the source electrode 105a and a lower end of the drain electrode 105b that are adjacent to each other over the oxide semiconductor film 103. When light exposure is performed for a channel length L smaller than 25 nm, the light exposure for forming the resist mask in the photolithography step may be performed using extreme ultraviolet light having an extremely short wavelength of several nanometers to several tens of nanometers, for example. In the light exposure by extreme ultraviolet light, the resolution is high and the focus depth is large. Thus, the channel length L of the transistor formed later can be reduced, whereby the operation speed of a circuit can be increased.

In order to reduce the number of photomasks used in a photolithography step and reduce the number of photolithography steps, an etching step may be performed with use of a multi-tone mask which is a light-exposure mask through which light is transmitted to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be achieved.

Note that it is preferable that etching conditions be optimized so as not to etch and divide the oxide semiconductor film 103 when the conductive film is etched. However, it is difficult to obtain etching conditions in which only the conductive film is etched and the oxide semiconductor film 103 is not etched at all. In some cases, only part of the oxide semiconductor film 103, e.g., 5% to 50% in thickness of the oxide semiconductor film 103, is etched, so that the oxide semiconductor film 103 has a groove portion (a recessed portion) when the conductive film is etched.

Figure 4E:
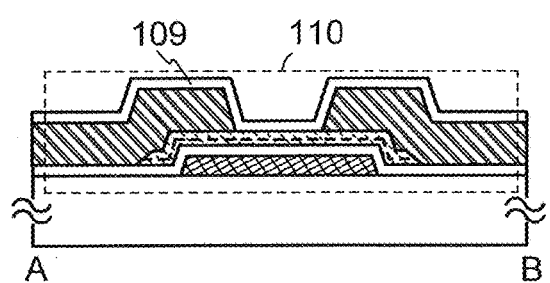

Next, the protective insulating film 109 which covers the source electrode 105a and the drain electrode 105b and is in contact with part of the oxide semiconductor film 103 is formed (see FIG. 4E). The protective insulating film 109 may be formed using an inorganic insulating film as a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, a silicon oxide film and an aluminum oxide film are sequentially formed to be stacked on the source electrode 105a and the drain electrode 105b side by a sputtering method.

Note that in this step, in the case where the protective insulating film 109 is formed by a sputtering method, it is effective to reduce the impact of a particle for forming the protective insulating film 109, which collides with the oxide semiconductor film 103, as like formation of the oxide semiconductor film 103. Thus, the region 103c is formed in the vicinity of the interface between the oxide semiconductor film 103 and the protective insulating film 109. Through this step, the transistor 120 illustrated in FIGS. 2A and 2B can be obtained. The region 103c in the oxide semiconductor film 103 is a region where a concentration of silicon distributed from an interface with the protective insulating film 109 toward the inside of the oxide semiconductor film 103 is lower than or equal to 1.0 at. %. The region 103c is preferably provided to be in contact with the protective insulating film 109 and have a thickness less than or equal to 5 nm.

Here, as the protective insulating film 109, an insulating film similar to the gate insulating film 102 can be used. In order to prevent impurities such as silicon from entering the oxide semiconductor film 103, mixing may be suppressed in the vicinity of the interface between the oxide semiconductor film 103 and the protective insulating film 109; thus, the impact of silicon included in the protective insulating film 109 colliding with the oxide semiconductor film 103 may be reduced. For example, as an applicable method, the power for depositing the protective insulating film 109 is reduced, the pressure for depositing the protective insulating film 109 is increased, or the T-S distance is increased.

As described above, the concentration of impurities such as silicon can also be reduced in the region 103c corresponding to the back channel of the oxide semiconductor film 103.

After the above steps, the manufacturing method of the transistor 110 and that of the transistor 120 are similar to each other.

After the protective insulating film 109 is formed, heat treatment is preferably performed on the oxide semiconductor film 103. The temperature of the heat treatment is higher than or equal to 300° C. and lower than or equal to 700° C., or lower than the strain point of the substrate.

The heat treatment may be performed in an atmosphere of nitrogen, oxygen, ultra-dry air (the moisture content is less than or equal to 20 ppm, preferably less than or equal to 1 ppm, further preferably less than or equal to 10 ppb), or a rare gas (such as argon or helium). Note that it is preferable that water, hydrogen, and the like be not contained in the atmosphere of nitrogen, oxygen, ultra-dry air, a rare gas, or the like. It is also preferable that the purity of nitrogen, oxygen, or the rare gas which is introduced into a heat treatment apparatus be set to greater than or equal to 6N (99.9999%), preferably greater than or equal to 7N (99.99999%) (that is, the impurity concentration is lower than or equal to 1 ppm, preferably lower than or equal to 0.1 ppm).

In the case of performing heat treatment after formation of the oxide semiconductor film, oxygen that is one of main component materials included in the oxide semiconductor might be reduced. However, during the heat treatment in this step, oxygen can be supplied to the oxide semiconductor film 103 from the gate insulating film 102 which is formed using oxidized material containing silicon; thus, oxygen vacancies in the oxide semiconductor film 103 can be filled.

By performing the heat treatment as described above, the oxide semiconductor film 103 can be highly purified so as not to contain impurities other than main components as little as possible. In addition, the highly purified oxide semiconductor film 103 includes extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$. In such a manner, the oxide semiconductor film 103 that becomes an i-type (intrinsic) oxide semiconductor can be formed.

Through the above steps, the transistor 110 is formed (see FIG. 4E). In the transistor 110, the concentration of impurities such as silicon taken into the region 103a of the oxide semiconductor film 103 is small. Thus, the transistor 110 can have stable electric characteristics.

A planarization insulating film may be formed over the transistor 110. For the planarization insulating film, a heat-resistant organic material such as an acrylic resin, a polyimide resin, a benzocyclobutene-based resin, a polyamide resin, or an epoxy resin can be used. Other than such organic materials, it is also possible to use a low-dielectric constant material (a low-k material), a siloxane-based resin, PSG (phosphosilicate glass), BPSG (borophosphosilicate glass), or the like. Note that the planarization insulating film may be formed by stacking a plurality of insulating films formed of any of these materials.

<Manufacturing Process of Transistor 130>

Next, an example of a manufacturing process of the transistor 130 in FIGS. 3A and 3B will be described with reference to FIGS. 5A to 5E.

Figure 5A:
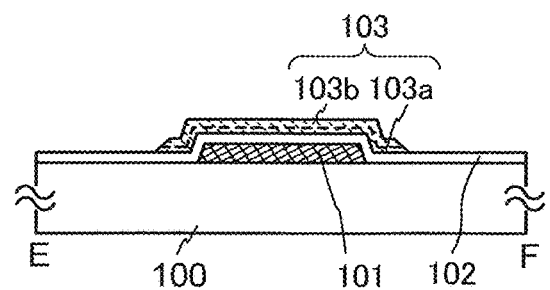
FIGS. 5A to 5E are cross-sectional views illustrating an example of a manufacturing process of a semiconductor device.

First, over the substrate 100, the gate electrode 101, the gate insulating film 102, and the oxide semiconductor film 103 including the region 103a and the region 103b are formed by steps similar to those (up to the step illustrated in FIG. 4C) of the transistor 110 (see FIG. 5A). For the details of the substrate 100, the gate electrode 101, the gate insulating film 102, and the oxide semiconductor film 103, the description with reference to FIGS. 4A to 4C can be referred to.

Figure 5B:
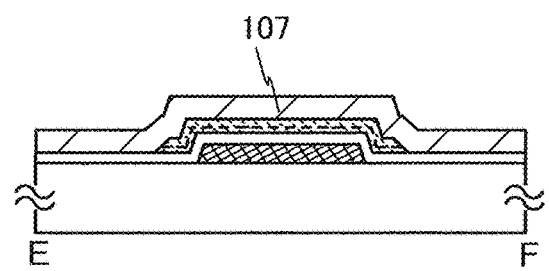

Next, an insulating film 107 used for a channel protective film is formed to a thickness greater than or equal to 5 nm and less than or equal to 300 nm (see FIG. 5B). As the insulating film 107, an inorganic insulating film containing oxygen is preferably used. For example, an insulating film such as a silicon oxide film, a silicon oxynitride film, an aluminum oxide film, an aluminum oxynitride film, a gallium oxide film, or a hafnium oxide film can be used. There is no particular limitation on a method for forming the insulating film 107; for example, a sputtering method, a MBE method, a CVD method, a pulse laser deposition method, an ALD method, or the like can be used as appropriate.

Figure 5C:
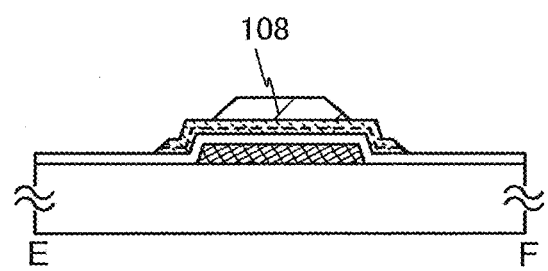
Figure 5D:
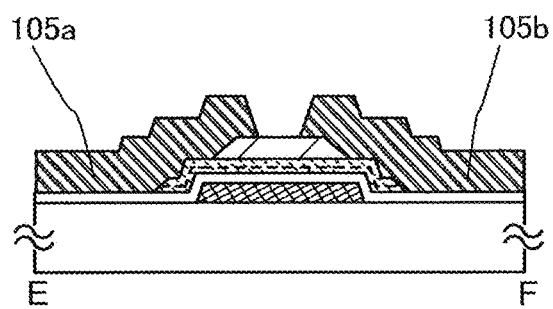

Next, a resist mask is formed over the insulating film 107 by a photolithography step, the channel protective film 108 is formed by etching, and then, the resist mask is removed (see FIG. 5C). Note that a resist mask used for forming the channel protective film 108 may be formed by an inkjet method. Formation of the resist mask by an inkjet method needs no photomask; thus, manufacturing cost can be reduced. Note that the etching of the channel protective film 108 may be performed using either dry etching or wet etching, or using both dry etching and wet etching.

As illustrated in FIG. 5C, an end portion of the channel protective film 108 preferably has a taper angle greater than or equal to 10° less than or equal to 60°. The channel protective film 108 is formed to have such a shape, whereby the field concentration in the vicinity of a lower end portion of the channel protective film 108 can be relaxed.

As described above, the channel protective film 108 is provided over and in contact with the oxide semiconductor film 103, so that damage on the back channel side of the oxide semiconductor film 103, which is caused by etching the source electrode 105a and the drain electrode 105b (e.g., damage caused by plasma or an etchant in the etching step), can be prevented. Accordingly, a semiconductor device including an oxide semiconductor and having stable electric characteristics can be provided.

Next, a conductive film used for a source electrode and a drain electrode (as well as a wiring formed in the same layer as the gate electrode) is formed over the channel protective film 108 and the oxide semiconductor film 103. Then, the conductive film is selectively etched by a photolithography step, so that the source electrode 105a and the drain electrode 105b are formed (see FIG. 5D). This step can be performed in a manner similar to the step illustrated in FIG. 4D; thus, for the details of the source electrode 105a and the drain electrode 105b, the description with reference to FIG. 4D can be referred to.

Figure 5E:
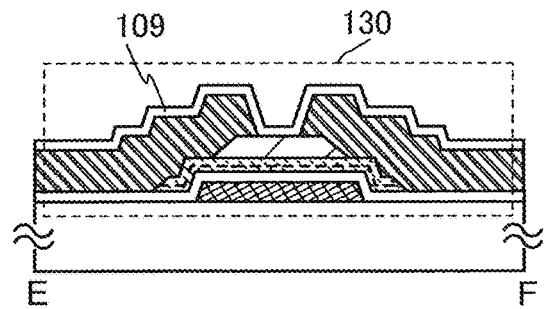

Next, the protective insulating film 109 is formed to cover the source electrode 105a, the drain electrode 105b, and the channel protective film 108 (see FIG. 5E). This step can be performed in a manner similar to the step illustrated in FIG. 4E; thus for the details of the protective insulating film 109, the description with reference to FIG. 4E can be referred to.

As described above, the oxide semiconductor film is formed, whereby the concentration of impurities included in the oxide semiconductor film in the vicinity of the formed film surface can be reduced. In addition, crystallization of the oxide semiconductor film 103 can be progressed in the vicinity of the formed film surface; thus, crystallinity of the oxide semiconductor film 103 can be improved. In the case where the oxide semiconductor film 103 is a CAAC-OS film, a crystal portion can be formed even in the vicinity of the formed film surface. Note that in the crystal portion, a c-axis is aligned in a direction perpendicular to the interface between the oxide semiconductor film 103 and the gate insulating film 102 or the interface between the oxide semiconductor film 103 and the protective insulating film 109. By using such an oxide semiconductor film, a highly reliable semiconductor device having stable electric characteristics can be provided.

The methods and structures described in this embodiment can be combined as appropriate with any of the methods and structures described in the other embodiments.

Embodiment 2

A semiconductor device (also referred to as a display device) with a display function can be manufactured using the transistor an example of which is described in Embodiment 1. Moreover, some or all of the driver circuits which include the transistor can be formed over a substrate where the pixel portion is formed, whereby a system-on-panel can be obtained.

Figure 9A:
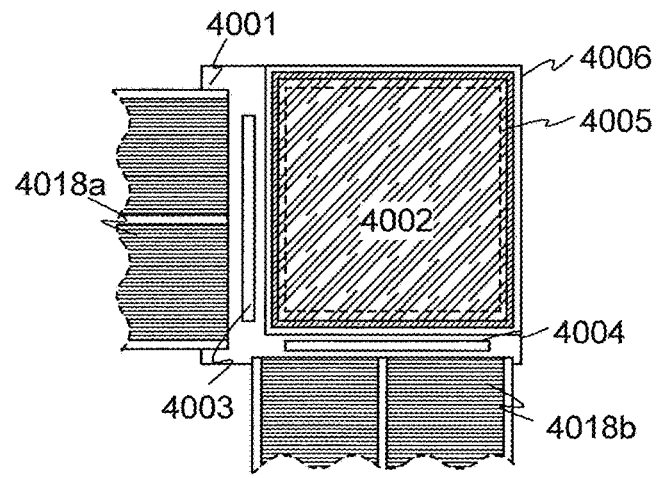
FIGS. 9A to 9C illustrate one embodiment of a semiconductor device.

In FIG. 9A, a sealant 4005 is provided so as to surround a pixel portion 4002 provided over a first substrate 4001, and the pixel portion 4002 is sealed by using a second substrate 4006. In FIG. 9A, a signal line driver circuit 4003 and a scan line driver circuit 4004 which are each formed using a single crystal semiconductor film or a polycrystalline semiconductor film over a substrate separately prepared are mounted in a region that is different from the region surrounded by the sealant 4005 over the first substrate 4001. Further, a variety of signals and potentials are supplied to the signal line driver circuit 4003 and the scan line driver circuit 4004, which are separately formed, or the pixel portion 4002 from flexible printed circuits (FPCs) 4018a and 4018b.

Figure 9B:
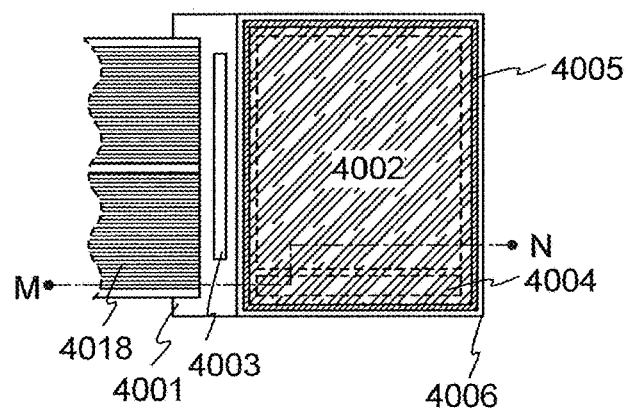
Figure 9C:
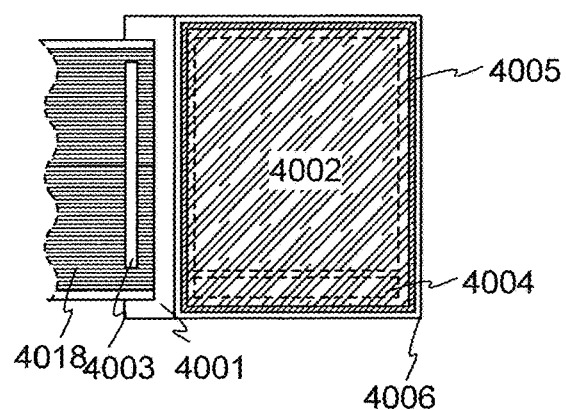

In FIGS. 9B and 9C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 9B and 9C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 9B and 9C, various signals and potential are supplied to the signal line driver circuit 4003 which is separately formed, the scan line driver circuit 4004, and the pixel portion 4002 from an FPC 4018.

Although FIGS. 9B and 9C each illustrate an example in which the signal line driver circuit 4003 is formed separately and mounted on the first substrate 4001, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 9A illustrates an example in which the signal line driver circuit 4003 and the scan line driver circuit 4004 are mounted by a COG method. FIG. 9B illustrates an example in which the signal line driver circuit 4003 is mounted by a COG method. FIG. 9C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device).

Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Embodiments of the semiconductor device will be described with reference to FIG. 10, FIG. 11, and FIG. 12.

Figure 10:
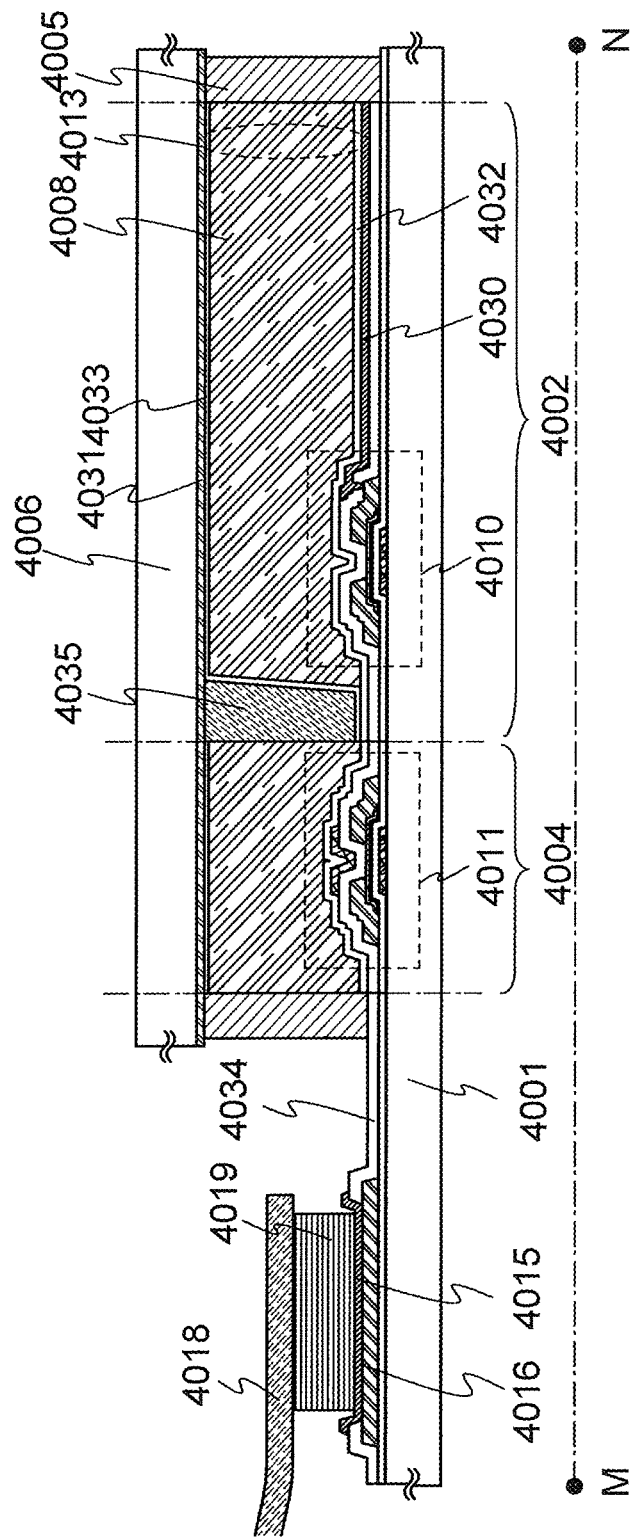
FIG. 10 illustrates one embodiment of a semiconductor device.
Figure 11:
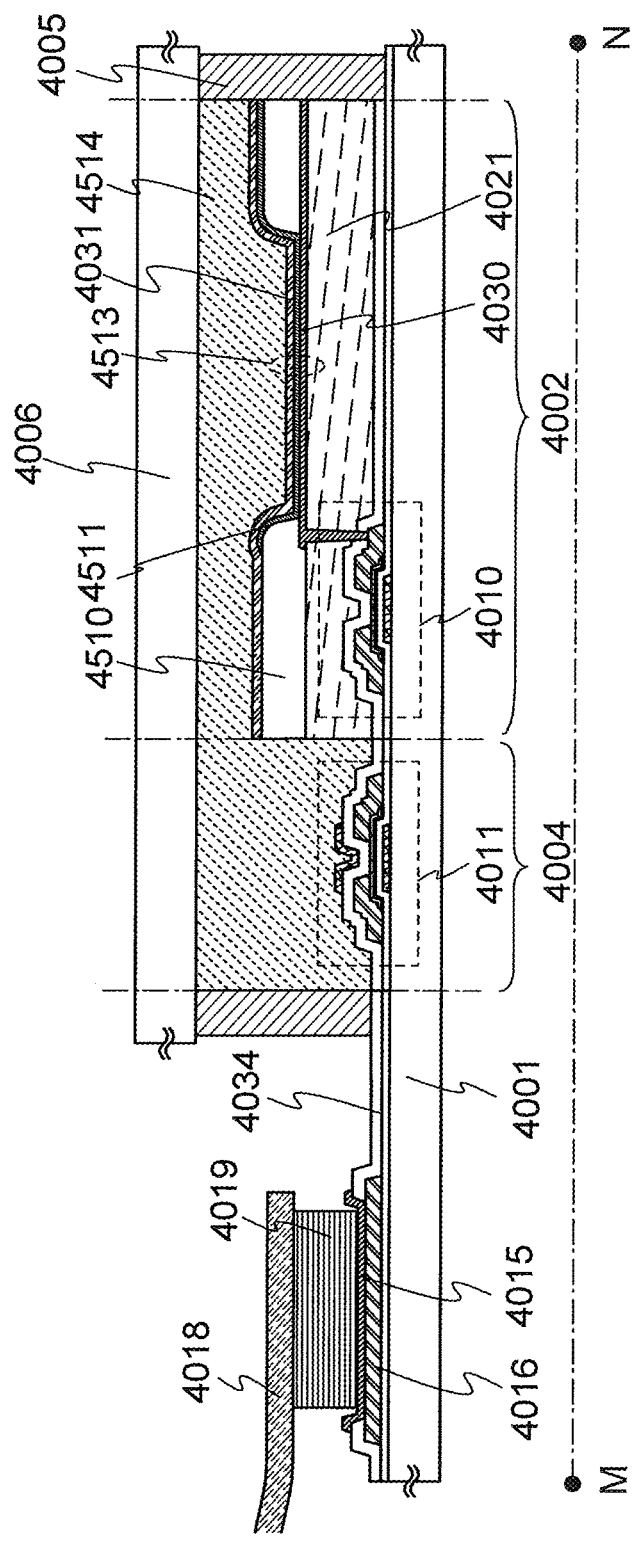
FIG. 11 illustrates one embodiment of a semiconductor device.
Figure 12:
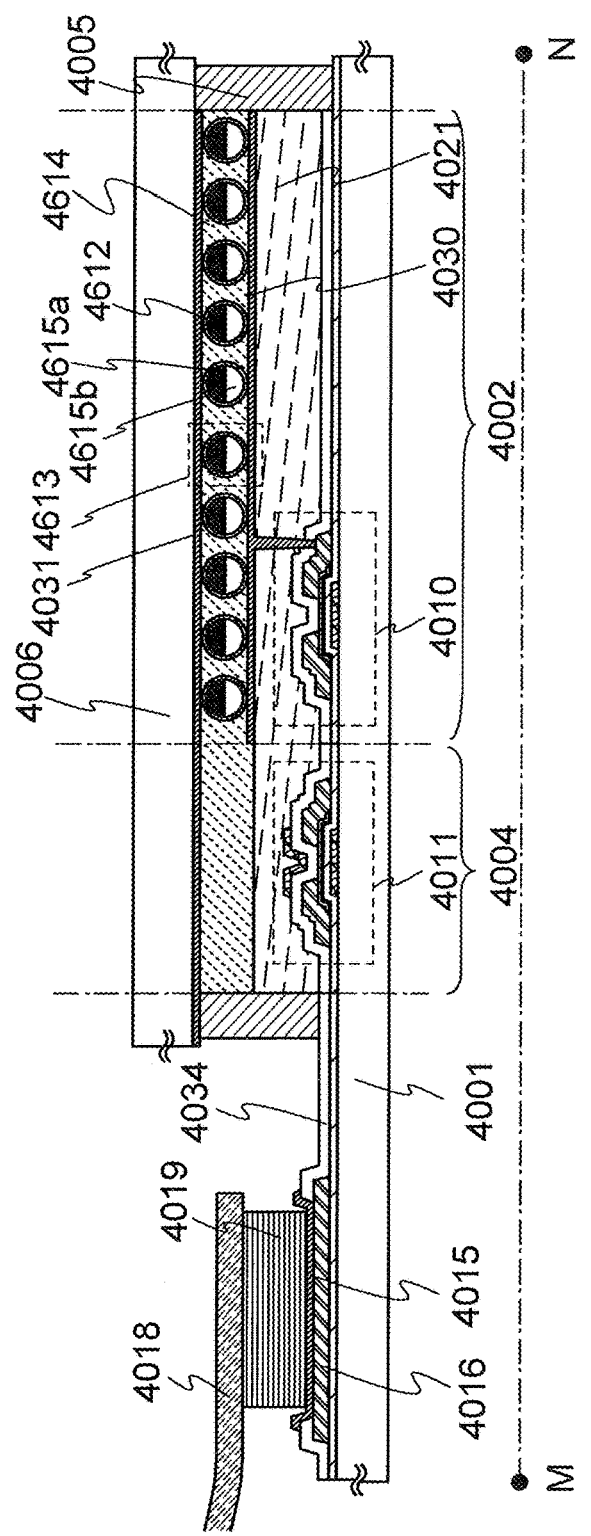
FIG. 12 illustrates one embodiment of a semiconductor device.

FIG. 10, FIG. 11, and FIG. 12 correspond to cross-sectional views taken along line M-N in FIG. 9B.

As illustrated in FIG. 10, FIG. 11, and FIG. 12, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed of the same conductive film as a first electrode layer 4030. The terminal electrode 4016 is formed of the same conductive film as a source electrode and a drain electrode of transistors 4010 and 4011.

Further, the pixel portion 4002 and the scan line driver circuit 4004 provided over the first substrate 4001 each include a plurality of transistors. FIG. 10, FIG. 11, and FIG. 12 each illustrate the transistor 4010 included in the pixel portion 4002 and the transistor 4011 included in the scan line driver circuit 4004.

In this embodiment, any of the transistors described in Embodiment 1 can be employed for the transistors 4010 and 4011. Variation in the electric characteristics of the transistors 4010 and 4011 is suppressed and the transistors 4010 and 4011 are electrically stable. Thus, as the semiconductor devices of this embodiment illustrated in FIG. 10, FIG. 11, and FIG. 12, a highly reliable semiconductor device can be provided.

The transistor 4011 included in the scan line driver circuit 4004 has a structure in which a second gate electrode is formed over an insulating film 4034. A voltage applied to the second gate electrode is controlled, whereby the threshold voltage of the transistor 4011 can be controlled.

The transistor 4010 included in the pixel portion 4002 is electrically connected to a display element to form a display panel. A variety of display elements can be used as the display element as long as display can be performed.

An example of a liquid crystal display device using a liquid crystal element as a display element is illustrated in FIG. 10. In FIG. 10, a liquid crystal element 4013 which is a display element includes a first electrode layer 4030, a second electrode layer 4031, and a liquid crystal layer 4008. Note that the insulating films 4032 and 4033 functioning as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A spacer 4035 is a columnar spacer which is obtained by selective etching of an insulating film and is provided in order to control the thickness (a cell gap) of the liquid crystal layer 4008. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes a liquid crystal exhibiting a blue phase and a chiral material has a short response time of 1 msec or less and has optical isotropy, which contributes to the exclusion of the alignment process and reduction of viewing angle dependence. In addition, since an alignment film does not need to be provided and rubbing treatment is also unnecessary, electrostatic discharge damage caused by the rubbing treatment can be prevented and defects and damage of the liquid crystal display device in the manufacturing process can be reduced. Thus, productivity of the liquid crystal display device can be increased.

The specific resistivity of the liquid crystal material is $1 \times 10^9$ Ω·cm or more, preferably $1 \times 10^{11}$ Ω·cm or more, much preferably $1 \times 10^{12}$ Ω·cm or more. The value of the specific resistivity in this specification is measured at 20° C.

The size of storage capacitor formed in the liquid crystal display device is set considering the leakage current of the transistor provided in the pixel portion or the like so that charge can be held for a predetermined period. By using the transistor including the high-purity oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current in an off state (the off-state current) can be made small. Accordingly, an electrical signal such as an image signal can be held for a longer period in the pixel, and a writing interval can be set longer in an on state. Therefore, frequency of refresh operation can be reduced, which leads to an effect of suppressing power consumption.

In addition, the transistor including the highly purified oxide semiconductor film used in this embodiment can have relatively high field-effect mobility and thus can operate at high speed. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode; for example, a multi-domain vertical alignment (MVA) mode, a patterned vertical alignment (PVA) mode, an advanced super-view (ASV) mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. However, one embodiment of the present invention is not limited to a color display device and can be applied to a monochrome display device.

Alternatively, as the display element included in the display device, a light-emitting element utilizing electroluminescence can be used. Light-emitting elements utilizing electroluminescence are classified in accordance with whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified in accordance with their element structures into a dispersion-type inorganic EL element and a thin-film inorganic EL element. A transistor and a light-emitting element are formed over a substrate. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device using a light-emitting element as a display element is illustrated in FIG. 11. A light-emitting element 4513 that is a display element is electrically connected to the transistor 4010 provided in the pixel portion 4002. A structure of the light-emitting element 4513 is not limited to the illustrated stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. Examples of such a resin include polyvinyl chloride (PVC), an acrylic resin, a polyimide resin, an epoxy resin, a silicone resin, polyvinyl butyral (PVB), and ethylene vinyl acetate (EVA). For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 12 illustrates an active matrix electronic paper as one embodiment of a semiconductor device. The electronic paper in FIG. 12 is an example of a display device using a twisting ball display system.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 10, FIG. 11, and FIG. 12, a flexible substrate as well as a glass substrate can be used as the first substrate 4001 and the second substrate 4006. For example, a light-transmitting plastic substrate or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

An insulating layer 4021 can be formed using an inorganic insulating material or an organic insulating material. Note that the insulating layer 4021 formed using a heat-resistant organic insulating material such as an acrylic resin, a polyimide resin, a benzocyclobutene resin, a polyamide resin, or an epoxy resin is preferably used as a planarizing insulating film. Other than such organic insulating materials, it is possible to use a low-dielectric constant material (a low-k material), a siloxane-based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer can be formed, depending on the material, by a sputtering method, a spin coating method, a dipping method, spray coating, a droplet discharge method (e.g., an inkjet method or the like), a printing method (e.g., screen printing, offset printing, or the like), roll coating, curtain coating, knife coating, or the like.

The display device displays an image by transmitting light from a light source or a display element. Thus, the substrates and the thin films such as insulating films and conductive films provided in the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken owing to static electricity or the like, a protective circuit for protecting the driver circuit is preferably provided. The protective circuit is preferably formed using a nonlinear element.

As described above, by using any of the transistors described in Embodiment 1, a semiconductor device having a high reliability can be provided. Note that the transistors described in Embodiment 1 can be applied to not only semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The methods and structures described in this embodiment can be combined as appropriate with any of the methods and structures described in the other embodiments.

Embodiment 3

A semiconductor device disclosed in this specification and the like can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 13A:
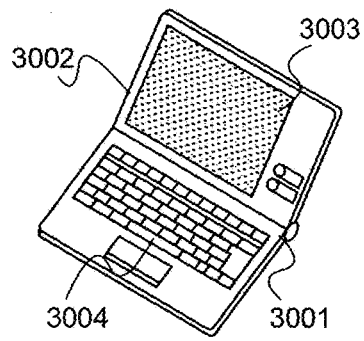
FIGS. 13A to 13F each illustrate an electronic device.

FIG. 13A illustrates a laptop personal computer, which includes a main body 3001, a housing 3002, a display portion 3003, a keyboard 3004, and the like. By applying the semiconductor device described in Embodiment 1 or 2, the laptop personal computer can have high reliability.

Figure 13B:
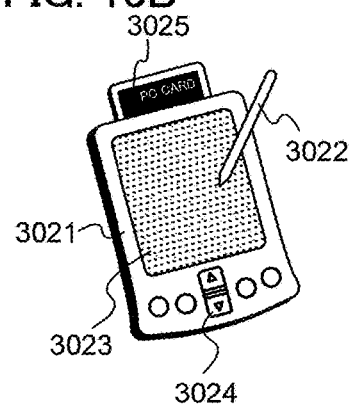

FIG. 13B illustrates a personal digital assistant (PDA) including a display portion 3023, an external interface 3025, an operation button 3024, and the like in a main body 3021. A stylus 3022 is included as an accessory for operation. By applying the semiconductor device described in Embodiment 1 or 2, the portable digital assistant (PDA) can have higher reliability.

Figure 13C:
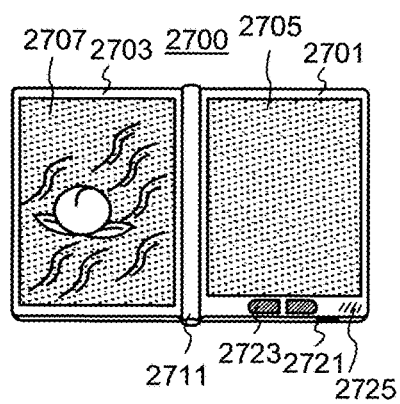

FIG. 13C illustrates an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 13C) can display text and a display portion on the left side (the display portion 2707 in FIG. 13C) can display images. By applying the semiconductor device described in Embodiment 1 or 2, the electronic book reader 2700 can have high reliability.

In FIG. 13C, the housing 2701 includes an operation portion and the like as an example. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 13D:
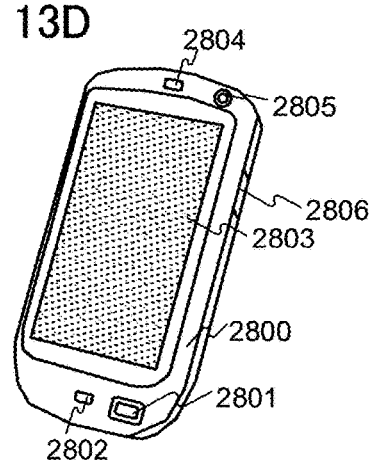

FIG. 13D illustrates a smartphone, which includes a housing 2800, a button 2801, a microphone 2802, a display portion 2803 provided with a touch panel, a speaker 2804, and a camera lens 2805 and functions as a mobile phone. By applying the semiconductor device described in Embodiment 1 or 2, the smartphone can have high reliability.

The display direction of the display portion 2803 can be changed depending on a usage pattern. Since the camera lens 2805 is provided on the same plane as the display portion 2803, videophone is possible. The speaker 2804 and the microphone 2802 can be used for operations such as video calls, sound recording, and playback without being limited to the voice call function.

An external connection terminal 2806 can be connected to an AC adapter and various types of cables such as a USB cable, and charging and data communication with a personal computer are possible. Furthermore, a large amount of data can be stored and moved by inserting a storage medium into the external memory slot (not illustrated).

Further, in addition to the above functions, an infrared communication function, a television reception function, or the like may be provided.

Figure 13E:
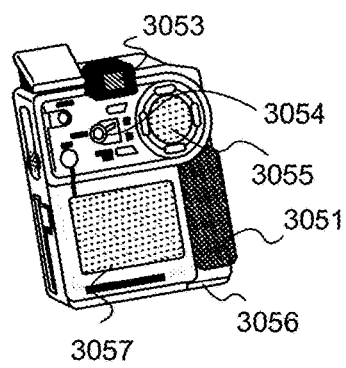

FIG. 13E illustrates a digital video camera which includes a main body 3051, a display portion A 3057, an eyepiece 3053, an operation switch 3054, a display portion B 3055, a battery 3056, and the like. By applying the semiconductor device described in Embodiment 1 or 2, the digital video camera can have high reliability.

Figure 13F:
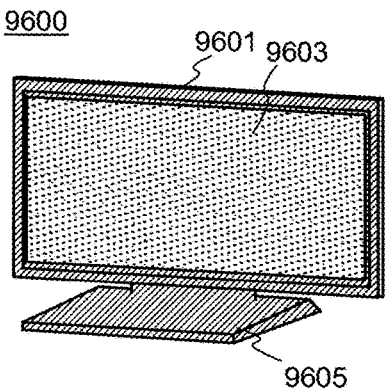

FIG. 13F illustrates an example of a television set. In a television set 9600, a display portion 9603 is incorporated in a housing 9601. The display portion 9603 can display images. Here, the housing 9601 is supported by a stand 9605. By applying the semiconductor device described in Embodiment 1 or 2, the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

Example 1

In this example, results of SIMS measurement of the concentration of silicon included in an oxide target will be described.

First, oxide targets used in this example are described.

As Sample A, an In—Ga—Zn-based oxide target (atomic ratio: In:Ga:Zn=2:1:3) was used. As Sample B, an In—Ga—Zn-based oxide target (atomic ratio: In:Ga:Zn=3:1:2) was used. As Sample C, an In—Sn—Zn-based oxide target (atomic ratio: In:Sn:Zn=2:1:3) was used. In addition, as Standard Sample D, an In—Ga—Zn-based oxide target (atomic ratio: In:Ga:Zn=1:1:1) to which silicon is added was used.

SIMS measurement was performed on Sample A, Sample B, Sample C, and Standard Sample D, so that the concentration of silicon included in each sample was measured.

Figure 14:
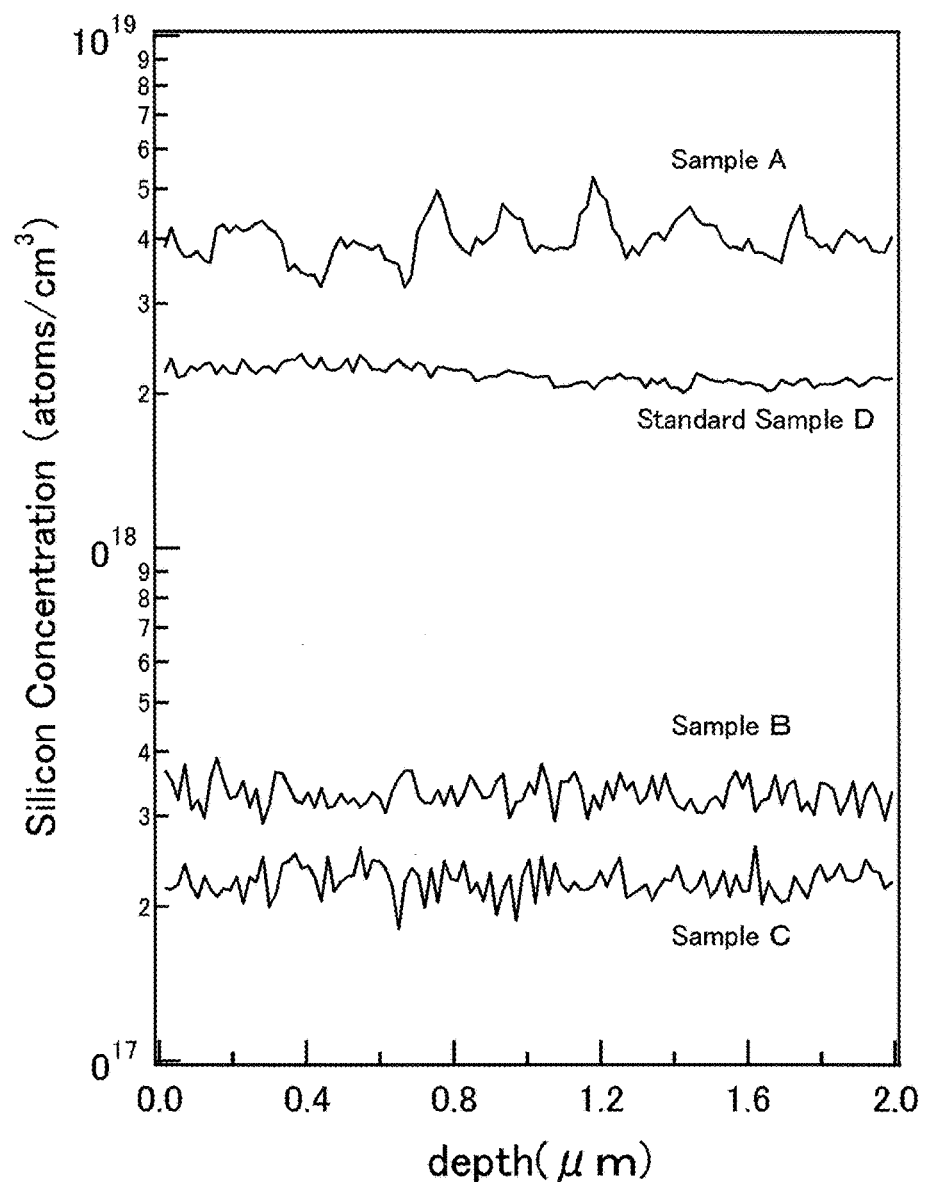
FIG. 14 is a graph showing measurement results according to one example of the present invention.

FIG. 14 shows results of SIMS measurement of Samples A to C and Standard Sample D.

As seen in FIG. 14, the concentration of silicon in Sample A is $4\times10^{18}$ atoms/cm$^3$, the concentration of silicon in Sample B is $3\times10^{17}$ atoms/cm$^3$, the concentration of silicon in Sample C is $2\times10^{17}$ atoms/cm$^3$, and the concentration of silicon in Standard Sample D is $2\times10^{18}$ atoms/cm$^3$. Note that the results of SIMS measurement of Samples A to C were quantified using Standard Sample D.

In the case where an oxide semiconductor film is deposited using any of Samples A to C and Standard Sample D, the above data can be used as a material for estimating whether silicon other than silicon in a target (e.g., silicon entered the oxide semiconductor film from an insulating film by mixing) is included in the oxide semiconductor film or not.

For example, in the case where in an oxide semiconductor film deposited using Sample A (an oxide target where In:Ga:Zn=2:1:3 (atomic ratio)) as a target, the concentration of silicon in the film is higher than $4\times10^{18}$ atoms/cm$^3$, it is found that silicon enters the oxide semiconductor film from a portion other than the target.

Example 2

The above embodiment describes that entry of an element that is a constituent element of an insulating film into an oxide semiconductor film is caused by mixing occurring in deposition of the oxide semiconductor film. However, as another cause, it can be considered that an element that is a constituent element of an insulating film diffuses into the oxide semiconductor film by heating a substrate after deposition of the oxide semiconductor film. Thus, in this example, experiment for examining whether entry of an element that is a constituent element of an insulating film into an oxide semiconductor film is caused by thermal diffusion will be described.

For the experiment, first, three substrates (over each of the substrates, an insulating film and an oxide semiconductor film were formed) were prepared. Then, a sample which was not subjected to heat treatment (hereinafter, called Sample E), a sample which was subjected to heat treatment at 450° C. (hereinafter, called Sample F), and a sample which was subjected to heat treatment at 650° C. (hereinafter, called Sample G) were manufactured. After that, in each sample, the concentration of silicon in the oxide semiconductor film in the vicinity of an interface with the gate insulating film was measured using a time-of-flight secondary ion mass spectrometer (ToF-SIMS).

Figure 15:
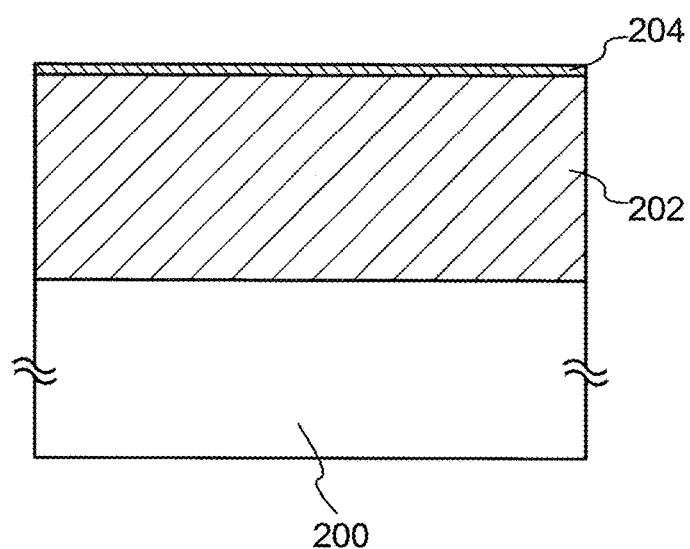
FIG. 15 illustrates a structure of a sample according to one example of the present invention.

A structure of a sample used for ToF-SIMS measurement is illustrated in FIG. 15.

The sample illustrated in FIG. 15 was obtained by depositing a silicon oxide film 202 over a silicon substrate 200, improving planarity of a surface with use of a chemical mechanical polishing (CMP) apparatus, depositing an IGZO film 204, and performing heat treatment.

The silicon oxide film 202 was deposited with a sputtering apparatus. The conditions for depositing the silicon oxide film 202 were as follows: substrate temperature, 100° C.; gas flow rate, Ar/O$_2$=25 sccm/25 sccm; deposition power, 1.5 kW (RF power supply); deposition pressure, 0.4 Pa; and thickness, 300 nm. As a sputtering target, a silicon oxide target was used. Note that before the silicon oxide film 202 was formed, an oxide film formed over the surface of the silicon substrate 200 was removed using diluted hydrofluoric acid.

The IGZO film 204 was deposited with a sputtering apparatus. The conditions for depositing the IGZO film 204 were as follows: substrate temperature, 200° C.; gas flow rate, $Ar/O_2$=30 sccm/15 sccm; deposition power, 0.5 kW (DC power supply); deposition pressure, 0.4 Pa; and thickness, 15 nm. Note that as a sputtering target, an oxide target (In:Ga:Zn=3:1:2 (atomic ratio)) was used.

The substrate was introduced into an electric furnace using a resistance heater or the like, and then the heat treatment was performed. The treatment conditions of Sample F were as follows: heating temperature, 450° C.; and heating time, one hour. The treatment conditions of Sample G were as follows: heating temperature, 650° C.; and heating time, one hour. Note that the heating atmosphere of both samples was a mixed atmosphere of nitrogen and oxygen. Sample E was not subjected to heat treatment.

Figure 16:
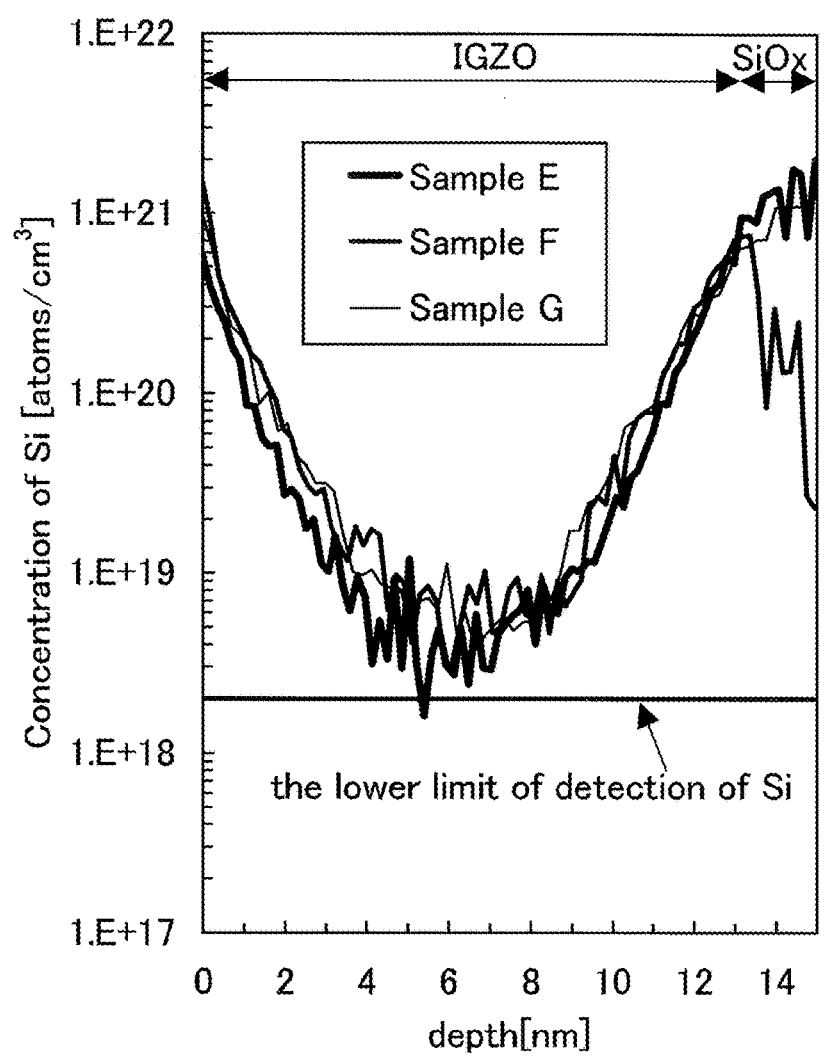
FIG. 16 is a graph showing measurement results according to one example of the present invention.

Next, Samples E to G were subjected to ToF-SIMS measurement from the substrate surface side (on the IGZO film 204 side), so that the concentration of silicon in the IGZO film in the vicinity of the interface with the silicon oxide film was measured. FIG. 16 shows results thereof.

The results shown in FIG. 16 indicates that in all the samples, the concentration of silicon in the oxide semiconductor film in the vicinity of the interface with the silicon oxide film is higher than $3 \times 10^{17}$ atoms/cm$^3$, the value of which is the concentration of silicon included in the In—Ga—Zn-based oxide target (In:Ga:Zn=3:1:2 (atomic ratio)) described in Example 1. Thus, it is found that silicon measured in the oxide semiconductor film in the vicinity of the interface with the silicon oxide film is not derived from the In—Ga—Zn-based oxide target.

In addition, as seen in FIG. 16, a significant difference of the inclination of the concentration of silicon (also referred to as silicon concentration gradient) in the IGZO film in the vicinity of the interface is not observed, between the sample which was not subjected to heat treatment (Sample E) and the samples which were subjected to heat treatment (Sample F and Sample G). Thus, entry of an element that is a constituent element of the insulating film into the oxide semiconductor film is caused not by thermal diffusion but by mixing.

Example 3

An experiment was conducted to examine whether entry of a constituent element of an insulating film into an oxide semiconductor film, which is caused by mixing, can be suppressed by decreasing the power for depositing the oxide semiconductor film. In this example, the experiment will be described.

In the experiment, four samples were manufactured in the following manner: first, insulating films were formed over substrates; four oxide semiconductor films were deposited over the respective insulating films with different power conditions (1 kW, 5 kW, 9 kW, and (1 kW+5 kW)); and heat treatment was performed on each substrate. Then, the concentration of silicon in the oxide semiconductor film in the vicinity of an interface with a gate insulating film of each sample was measured with a ToF-SIMS method.

Figure 17:
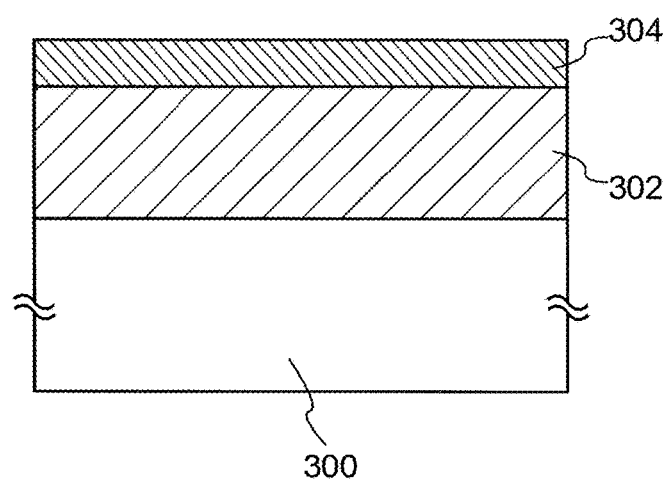
FIG. 17 illustrates a structure of a sample according to one example of the present invention.

FIG. 17 illustrates a structure of the sample used for ToF-SIMS measurement.

The sample illustrated in FIG. 17 was obtained by depositing a silicon oxynitride film 302 over a substrate 300, depositing an IGZO film 304, and performing heat treatment.

The silicon oxynitride film 302 was deposited with use of a high-density plasma CVD apparatus. The conditions for depositing the silicon oxynitride film 302 were as follows: substrate temperature, 325° C.; gas flow rate, $SiH_4/N_2O/Ar$=250 sccm/2500 sccm/2500 sccm; deposition power, 5 kW (four microwave power sources were used for the respective samples); deposition pressure, 30 Pa; and thickness, 100 nm. Note that the surface of the glass substrate 300 was cleaned to remove particles and the like before formation of the silicon oxynitride film 302.

The IGZO film 304 was deposited with use of a sputtering apparatus. The conditions for depositing the IGZO film 304 were as follows: substrate temperature, 170° C.; gas flow rate, $Ar/O_2$=100 sccm/100 sccm; deposition pressure, 0.6 Pa; thickness, 35 nm; and deposition power, four conditions of 1 kW, 5 kW, 9 kW, and (1 kW+5 kW) (an AC power source was used for each sample). Note that as a sputtering target, an oxide target (In:Ga:Zn=1:1:1 [atomic ratio]) was used.

Note that the above deposition power "1 kW+5 kW" means that a power of 1 kW was used for a 5-nm-thick film deposition and then a power of 5 kW was used for a 30-nm-thick film deposition. Hereinafter, a sample in which an oxide semiconductor film was deposited with 9 kW is referred to as Sample H, a sample in which an oxide semiconductor film was deposited with 5 kW is referred to as Sample I, a sample in which an oxide semiconductor film was deposited with 1 kW is referred to as Sample J, and a sample in which an oxide semiconductor film was deposited with (1 kW+5 kW) is referred to as Sample K.

The substrates were introduced into an electric furnace using a resistance heater or the like, and heat treatment was performed. The heat treatment was performed first for one hour at a temperature of 450° C. in an $N_2$ atmosphere, and then performed for one hour at a temperature of 650° C. in a ($N_2+O_2$) atmosphere.

Figure 18B:
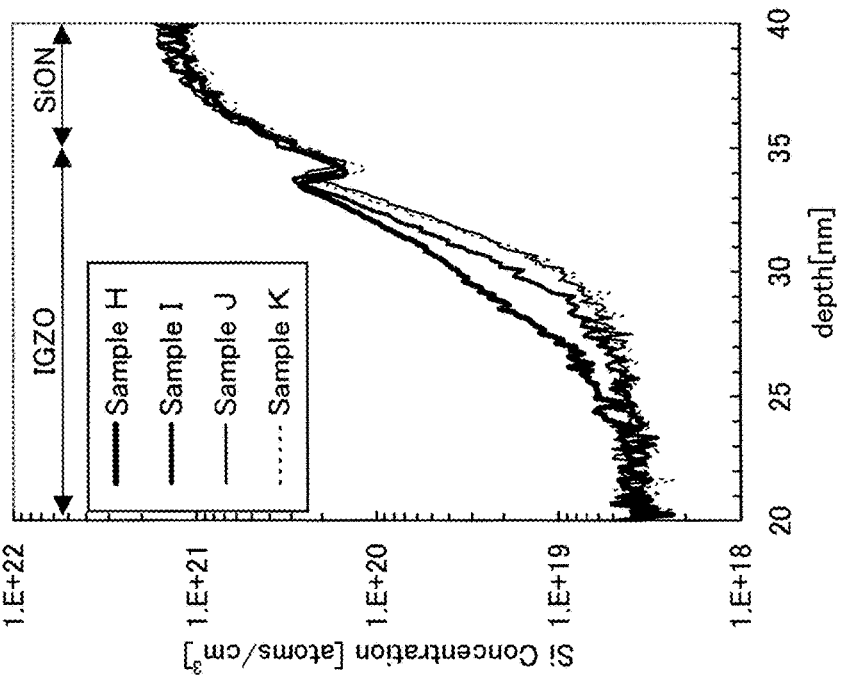
FIGS. 18A and 18B are graphs showing measurement results according to one example of the present invention.
Figure 18A:
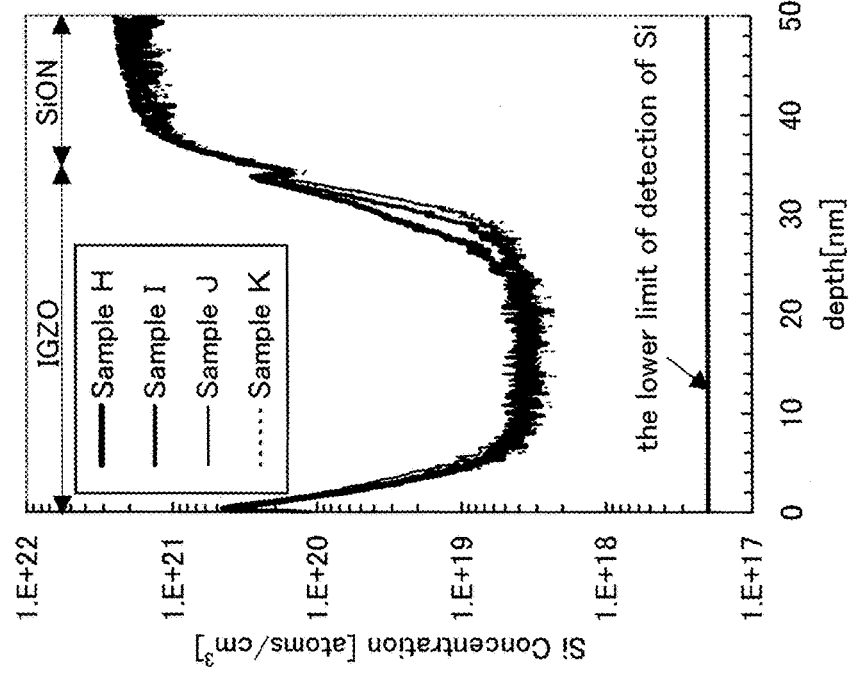

Next, Sample H to Sample K were subjected to ToF-SIMS measurement from the substrate surface side (the IGZO film 304 side) to measure the silicon concentration in the IGZO film in the vicinity of an interface with the silicon oxynitride film. The results are shown in FIGS. 18A and 18B. Note that FIG. 18B shows part of FIG. 18A which is enlarged.

From FIGS. 18A and 18B, it can be found that in all of the samples, the silicon concentration in the IGZO film in the vicinity of the interface with the silicon oxynitride film is higher than $2 \times 10^{18}$ atoms/cm$^3$, the value of which is the silicon concentration in the In—Ga—Zn-based oxide target (In:Ga:Zn=1:1:1 [atomic ratio]) described in Example 1. Thus, silicon measured in the IGZO film in the vicinity of the interface with the silicon oxynitride film is not derived from an In—Ga—Zn-based oxide target.

In addition, as can be seen from FIGS. 18A and 18B, the concentration of silicon in the IGZO film in the vicinity with the interface with the silicon oxynitride film tends to decrease as the deposition power is decreased. According to the above, entry of a constituent element of the insulating film into the oxide semiconductor film, which is caused by mixing, can be suppressed by decreasing the power for depositing the oxide semiconductor film.

Furthermore, the silicon concentrations of Sample J and Sample K are substantially the same, which indicates that entry of a constituent element of the insulating film into the oxide semiconductor film, which is caused by mixing, can be suppressed even when deposition of the oxide semiconductor film is performed with a low power in the initial stage and then the rest of deposition is performed with the increased power.

Example 4

In this example, the measurement results of crystal states in oxide semiconductor films will be described. The crystal states are generated by entering an element that is a constituent element of an insulating film into the oxide semiconductor films.

First, two substrates over which oxide semiconductor films were formed with use of targets having different compositions were prepared, and then each substrate was divided into three. After that, the substrates each of which has been divided into three were subjected to heat treatment under different conditions from each other. As a result, six samples were manufactured, in total, under different conditions. Then, a crystal state of the oxide semiconductor film in each sample was measured with X-ray diffraction (XRD).

Figure 19A:
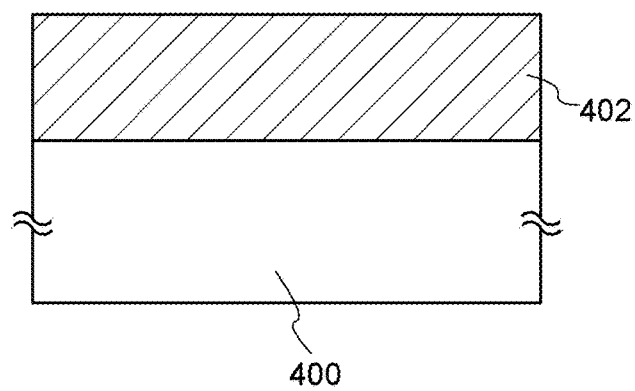
FIGS. 19A and 19B each illustrate a structure of a sample according to one example of the present invention.

First, a structure of the samples used for XRD measurement is illustrated in FIG. 19A.

The sample illustrated in FIG. 19A was obtained by depositing an IGZO film 402 with use of an IGZO (In:Ga:Zn=1:1:1 (atomic ratio)) target to which $SiO_2$ was added over a substrate 400 and performing heat treatment.

The IGZO film 402 was deposited with a sputtering apparatus. The conditions for depositing the IGZO film 402 were as follows: substrate temperature, 200° C.; deposition power, 100 W; deposition pressure, 0.4 Pa; gas flow rate, $O_2$=10 sccm; and thickness, 100 nm. Note that as sputtering targets, a target (In:Ga:Zn=1:1:1 (atomic ratio)) to which $SiO_2$ was added at 2 wt. % and a target (In:Ga:Zn=1:1:1 (atomic ratio)) to which $SiO_2$ was added at 5 wt. % were used. Note that before the IGZO film 402 was deposited, the surface of the glass substrate 400 was cleaned, so that particles and the like were removed.

Each substrate was introduced into an electric furnace using a resistance heater or the like, and then the heat treatment was performed. One of the three substrates which had been obtained by division after deposition of the IGZO film was subjected to heat treatment at 650° C. for one hour in an $N_2$ atmosphere, and then subjected to heat treatment at 650° C. for one hour in an $O_2$ atmosphere. Another of the three substrates obtained by division was subjected to heat treatment at 450° C. for one hour in an $N_2$ atmosphere, and then subjected to heat treatment at 450° C. for one hour in an $O_2$ atmosphere. Further, the other of the three substrates obtained by division was not subjected to heat treatment.

With use of the above targets, heat treatment was performed under the above conditions, so that six kinds of samples (Samples L to Q shown in Table 1) were made.

Figure 20A:
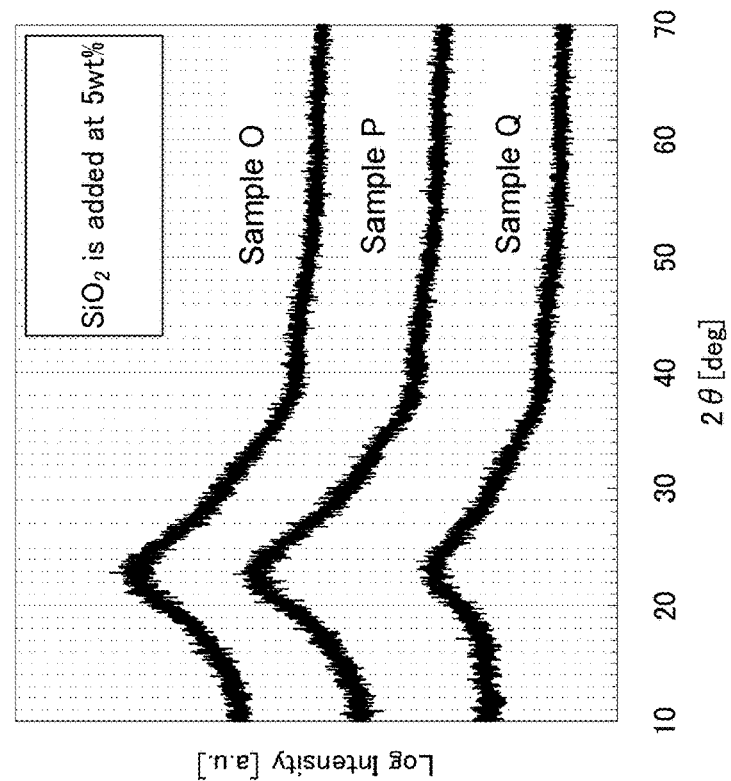
FIGS. 20A and 20B are graphs showing measurement results according to one example of the present invention.
Figure 20B:
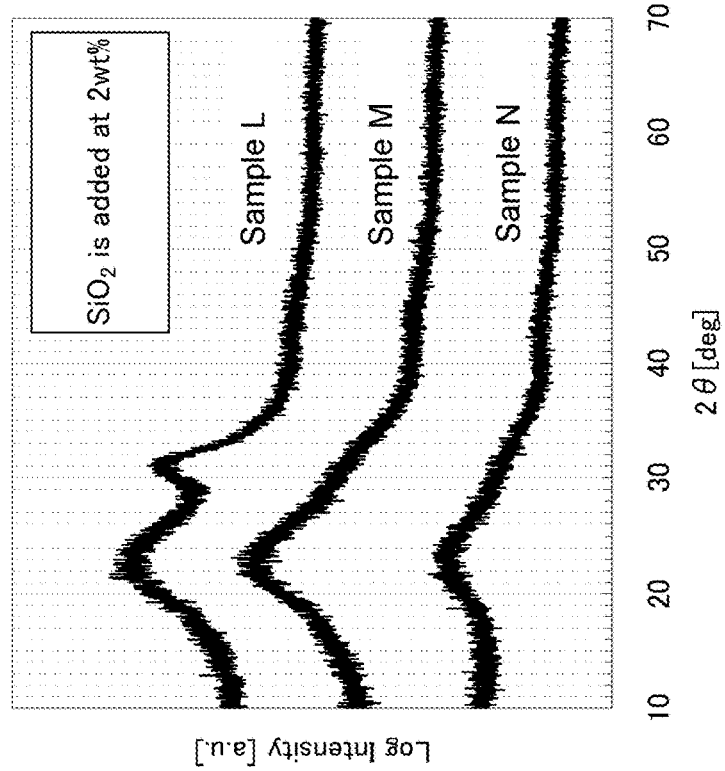

Next, XRD measurement was performed on the IGZO films in Samples L to Q, so that a crystal state of each film was measured. Results thereof are shown in FIGS. 20A and 20B. FIG. 20A shows XRD measurement results of Samples L to N, and FIG. 20B shows XRD measurement results of Samples O to Q.

As seen in FIG. 20A, Sample L which was subjected to heat treatment at 650° C. within the temperature range described in the above has a peak attributed to crystal at around 31° (=29). On the other hand, all the samples shown in FIG. 20B has no peak attributed to crystal. According to the above results, in the IGZO film, crystallization by heat treatment is inhibited when excess silicon is included as impurities.

Next, in order to measure the rate of silicon in an IGZO film deposited with use of a target to which silicon is added at 2 wt. %, composition of elements included in the IGZO film were measured with X-ray photoelectron spectroscopy (XPS).

Figure 19B:
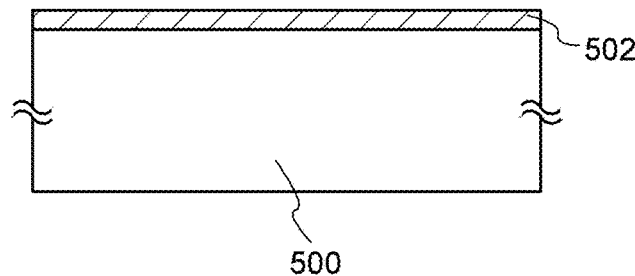

Each sample used for XPS measurement has a structure in which an IGZO film 502 is deposited over a silicon substrate 500 as illustrated in FIG. 19B.

The IGZO film 502 was deposited with a sputtering apparatus. The conditions for depositing the IGZO film 502 were as follows: substrate temperature, 200° C.; deposition power, 100 W; deposition pressure, 0.4 Pa; gas flow rate, $O_2$=10 sccm; and thickness, 15 nm. Note that as a sputtering target, a target (In:Ga:Zn=1:1:1 (atomic ratio)) to which $SiO_2$ was added at 2 wt. % was used. Note that before the IGZO film 502 was deposited, an oxide film formed over the surface of the silicon substrate 500 was removed with use of diluted hydrofluoric acid.

By the XPS measurement, it was observed that silicon was included, at 1.1 at. %, in the IGZO film deposited with use of the target to which $SiO_2$ was added at 2 wt. %.

According to the above, when impurities such as silicon enter, by mixing or the like, the oxide semiconductor film in the vicinity of the interface with the gate insulating film, crystallization of a channel formation region in the oxide semiconductor film is potentially inhibited. As a result, this example shows that it is important to reduce the concentration of silicon in the oxide semiconductor film in the vicinity of the interface with the gate insulating film.

EXPLANATION OF REFERENCE

100: substrate, 101: gate electrode, 102: gate insulating film, 103: oxide semiconductor film, 103a: region, 103b: region, 103c: region, 105a: source electrode, 105b: drain electrode, 107: insulating film, 108: channel protective film, 109: protective insulating film, 110: transistor, 120: transistor, 130: transistor, 200: silicon substrate, 202: silicon oxide film, 204: IGZO film, 300: glass substrate, 302: silicon

TABLE 1

| Sample | Target | Heat Condition |
|---|---|---|
| L | In:Ga:Zn = 1:1:1 + SiO$_2$ (2 wt %) | <<650° C., N$_2$ atmosphere, one hour>> + <<650° C., O$_2$ atmosphere, one hour>> |
| M | In:Ga:Zn = 1:1:1 + SiO$_2$ (2 wt %) | <<450° C., N$_2$ atmosphere, one hour>> + <<450° C., O$_2$ atmosphere, one hour>> |
| N | In:Ga:Zn = 1:1:1 + SiO$_2$ (2 wt %) | No Heat Treatment |
| O | In:Ga:Zn = 1:1:1 + SiO$_2$ (5 wt %) | <<650° C., N$_2$ atmosphere, one hour>> + <<650° C., O$_2$ atmosphere, one hour>> |
| P | In:Ga:Zn = 1:1:1 + SiO$_2$ (5 wt %) | <<450° C., N$_2$ atmosphere, one hour>> + <<450° C., O$_2$ atmosphere, one hour>> |
| Q | In:Ga:Zn = 1:1:1 + SiO$_2$ (5 wt %) | No Heat Treatment | oxynitride film, 304: IGZO film, 400: glass substrate, 402: IGZO film, 500: silicon substrate, 502: IGZO film, 2700: e-book reader, 2701: housing, 2703: housing, 2705: display portion, 2707: display portion, 2711: hinge, 2721: power switch, 2723: operation key, 2725: speaker, 2800: housing, 2801: button, 2802: microphone, 2803: display portion, 2804: speaker, 2805: camera lens, 2806: external connection terminal, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3056: battery, 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4019: anisotropic conductive film, 4021: insulating layer, 4030: electrode layer, 4031: electrode layer, 4032: insulating film, 4033: insulating film, 4034: insulating film, 4510: partition wall, 4511: electroluminescent layer, 4513: light-emitting element, 4514: filler, 4612: cavity, 4613: spherical particle, 4614: filler, 4615*a*: black region, 4615*b*: white region, 9600: television set, 9601: housing, 9603: display portion, 9605: stand This application is based on Japanese Patent Application serial no. 2011-215682 filed with Japan Patent Office on Sep. 29, 2011, the entire contents of which are hereby incorporated by reference.

The invention claimed is:

1. A semiconductor device comprising:
an oxide semiconductor film over a substrate;
a source electrode and a drain electrode electrically connected to the oxide semiconductor film;
a gate electrode; and
a gate insulating film between the gate electrode and the oxide semiconductor film,
wherein the oxide semiconductor film comprises a first region in which a concentration of carbon is lower than or equal to $1.0 \times 10^{19}$ atoms/cm$^3$, and
wherein the oxide semiconductor film comprises a second region in which a concentration of carbon is lower than the concentration of carbon in the first region.

2. The semiconductor device according to claim 1,
wherein the first region is located at an interface between the oxide semiconductor film and the gate insulating film and in contact with the gate insulating film.

3. The semiconductor device according to claim 1,
wherein the gate insulating film is located over the oxide semiconductor film, and
wherein the gate insulating film comprises an oxide containing silicon.

4. The semiconductor device according to claim 1, wherein an end portion of the oxide semiconductor film is tapered at an angle of 20° to 50°.

5. The semiconductor device according to claim 1, further comprising an interlayer insulating film over the gate insulating film and the gate electrode.

6. The semiconductor device according to claim 1, wherein the oxide semiconductor film comprises a crystal portion in which a c-axis is aligned in a direction perpendicular to a surface of the oxide semiconductor film.

7. A semiconductor device comprising:
a gate electrode;
a gate insulating film over the gate electrode;
an oxide semiconductor film comprising a channel formation region over the gate insulating film;
a source electrode and a drain electrode electrically connected to the oxide semiconductor film;
wherein the gate insulating film comprises an oxide containing silicon,
wherein the oxide semiconductor film comprises a first region having crystallinity in which a concentration of silicon is lower than or equal to 1.0 at. %,
wherein the first region is in contact with the gate insulating film,
wherein the oxide semiconductor film comprises a second region in which a concentration of silicon is lower than the concentration of silicon in the first region, and
wherein the oxide semiconductor film comprises indium, gallium and zinc.

8. The semiconductor device according to claim 7, wherein an end portion of the oxide semiconductor film is tapered at an angle of 20° to 50°.

9. The semiconductor device according to claim 7, further comprising an interlayer insulating film over the gate insulating film and the gate electrode.

10. The semiconductor device according to claim 7, wherein in the first region having crystallinity, a c-axis is aligned in a direction perpendicular to a surface of the oxide semiconductor film.

11. The semiconductor device according to claim 7,
wherein the concentration of silicon in the first region having crystallinity is lower than or equal to 0.1 at. %.

12. The semiconductor device according to claim 7,
wherein the first region having crystallinity is located at an interface between the oxide semiconductor film and the gate insulating film and in contact with the gate insulating film.

* * * * *